US012772483B2

(12) United States Patent
Ito

(10) Patent No.: US 12,772,483 B2
(45) Date of Patent: Oct. 20, 2026

(54) NITRIDE SEMICONDUCTOR DEVICE

(71) Applicant: ROHM CO., LTD., Kyoto (JP)

(72) Inventor: Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 511 days.

(21) Appl. No.: 18/039,729

(22) PCT Filed: Oct. 26, 2021

(86) PCT No.: PCT/JP2021/039483
§ 371 (c)(1),
(2) Date: Jun. 1, 2023

(87) PCT Pub. No.: WO2022/123935
PCT Pub. Date: Jun. 16, 2022

(65) Prior Publication Data
US 2024/0030336 A1 Jan. 25, 2024

(30) Foreign Application Priority Data
Dec. 8, 2020 (JP) ................................ 2020-203232

(51) Int. Cl.
*H01L 29/778* (2006.01)
*H10D 30/47* (2025.01)
(Continued)

(52) U.S. Cl.
CPC ....... *H10D 30/4755* (2025.01); *H10D 62/343* (2025.01); *H10D 62/854* (2025.01); *H10D 30/015* (2025.01); *H10D 62/8503* (2025.01)

(58) Field of Classification Search
CPC ............. H10D 30/4755; H10D 62/343; H10D 62/854; H10D 30/015; H10D 62/8503;
(Continued)

(56) References Cited

U.S. PATENT DOCUMENTS 8,436,398 B2 * 5/2013 Lidow .................. H10D 30/675
257/190
9,117,890 B2 * 8/2015 Kim ..................... H10D 62/343
(Continued)

FOREIGN PATENT DOCUMENTS

JP 2013-123047 A 6/2013
JP 2014-086698 A 5/2014
(Continued)

OTHER PUBLICATIONS

Office Action mailed May 27, 2025 in corresponding Japanese patent application No. 2022-568093 (7 pages; with English translation).

(Continued)

*Primary Examiner* — Jay C Kim
(74) *Attorney, Agent, or Firm* — XSENSUS LLP

(57) ABSTRACT

A nitride semiconductor device includes: an electron transport layer constituted by a nitride semiconductor; an electron supply layer formed on the electron transport layer and constituted by a nitride semiconductor that has a larger band gap than the electron transport layer; a gate layer formed on the electron supply layer and constituted by a nitride semiconductor that has a smaller band gap than the electron supply layer and includes an acceptor impurity; a gate electrode formed on the gate layer; and a drain electrode and a source electrode in contact with the electron supply layer. The acceptor impurity includes zinc and magnesium, and the concentration profile of the zinc in the thickness direction of the gate layer is different from the concentration profile of the magnesium in the thickness direction of the gate layer.

20 Claims, 8 Drawing Sheets

(51) Int. Cl.
*H10D 62/17* (2025.01)
*H10D 62/854* (2025.01)
*H10D 30/01* (2025.01)
*H10D 62/85* (2025.01)

(58) Field of Classification Search
CPC ...... H10D 30/475; H10D 62/10; H10P 14/24; H10P 14/3416; H10P 14/3444; H10P 14/3446; H10H 20/8162
See application file for complete search history.

(56) References Cited

U.S. PATENT DOCUMENTS

| | | | | |
|---|---|---|---|---|
| 9,412,856 | B2 * | 8/2016 | Fujimoto | H10D 62/343 |
| 9,577,084 | B2 * | 2/2017 | Hikita | H10D 30/4755 |
| 9,960,265 | B1 * | 5/2018 | Banerjee | H10D 30/475 |
| 10,714,607 | B1 * | 7/2020 | Chiang | H10D 62/854 |
| 11,171,228 | B2 * | 11/2021 | Okita | H10D 30/4755 |
| 11,527,606 | B2 * | 12/2022 | Chou | H10D 30/015 |
| 11,855,199 | B2 * | 12/2023 | Yeh | H01L 21/0254 |
| 2013/0153923 | A1 | 6/2013 | Decoutere | |
| 2014/0120703 | A1 | 5/2014 | Iwami | |
| 2015/0318374 | A1 | 11/2015 | Decoutere | |
| 2017/0104091 | A1 | 4/2017 | Tanaka | |
| 2019/0334022 | A1 * | 10/2019 | Buckley | H10D 84/038 |
| 2020/0119178 | A1 * | 4/2020 | Okita | H10D 30/015 |
| 2020/0365694 | A1 | 11/2020 | Ito et al. | |

FOREIGN PATENT DOCUMENTS

| | | | |
|---|---|---|---|
| JP | 2015-115371 | A | 6/2015 |
| JP | 2017-073506 | A | 4/2017 |

OTHER PUBLICATIONS

International Search Report and Written Opinion mailed on Feb. 1, 2022, received for PCT Application PCT/JP2021/039483, filed on Oct. 26, 2021, 9 pages including English Translation.

Office Action issued Jun. 6, 2024 in German Patent Application No. 112021006044.9 with English translation.

Kim, K. S. et al., Codoping characteristics of Zn with Mg in GaN. In: Applied physics letters, vol. 77, 2000, No. 8, S. 1123-1125. ISSN 1077-3118. https://doi.org/10.1063/1.1289494 [retrieved on Oct. 11, 2025].

Office Action dated Nov. 11, 2025, issued in corresponding German Patent Application No. 112021006044.9 (8 pages; with English translation).

* cited by examiner

NITRIDE SEMICONDUCTOR DEVICE

CROSS-REFERENCE TO RELATED APPLICATIONS

The present application is based on PCT filing PCT/JP2021/039483, filed Oct. 26, 2021, and claims priority to JP 2020-203232, filed Dec. 8, 2020, the entire contents of each are incorporated herein by reference.

TECHNICAL FIELD

The present disclosure relates to a nitride semiconductor device.

BACKGROUND ART

In recent years, a high-electron-mobility transistor (hereafter referred to as HEMT) that uses a nitride semiconductor as the main material of an active region has been developed and applied to a power device. The nitride semiconductor is a semiconductor that uses nitrogen as a group V element in a group III-V semiconductor. As compared to a typical silicon carbide (SiC) power device, a power device that uses a nitride semiconductor is recognized as a device capable of operating at higher speeds and higher frequencies than the SiC power device in addition to having a low on-resistance property in the same manner as the SiC power device.

From the viewpoint of being fail-safe, a power transistor such as a HEMT is required to be normally off so that the source-drain current path (channel) is disconnected when no gate voltage is applied, that is, in the zero bias state. Patent Literature 1 discloses a HEMT that achieves a normally-off power transistor.

The HEMT disclosed in Patent Literature 1 includes a gallium nitride (GaN) layer, which is also referred to as an electron transit layer, and an aluminum gallium nitride (AlGaN) layer, which is also referred to as an electron supply layer and is formed on the electron transit layer. The GaN layer and the AlGaN layer form a heterojunction. A two-dimensional electron gas (2DEG) is formed as a channel in the GaN layer in the vicinity of the heterojunction interface between the electron transit layer and the electron supply layer. A GaN layer (p-type GaN layer) that is doped with an acceptor impurity is disposed on the electron supply layer in a region immediately below the gate electrode. The acceptor impurity included in the p-type GaN layer causes the channel in the electron transit layer to disappear from the region immediately below the gate electrode. This achieves the normally-off operation. Application of an appropriate on-voltage to the gate electrode induces the channel in the region immediately below the gate electrode. This electrically connects the source and the drain.

CITATION LIST

Patent Literature

Patent Literature 1: Japanese Laid-Open Patent Publication No. 2017-73506

SUMMARY OF INVENTION

Technical Problem

It is desirable for a HEMT such as that described in Patent Literature 1 to have a threshold voltage that is sufficient to ensure the normally-off operation. In general, an increase in the threshold voltage of the HEMT has a trade-off relationship with a decrease in the on-resistance of the HEMT. Therefore, a high threshold voltage needs to be obtained while limiting increases in the on-resistance.

Solution to Problem

An aspect of the present disclosure is a nitride semiconductor device that includes an electron transit layer formed from a nitride semiconductor, an electron supply layer formed on the electron transit layer, the electron supply layer being formed from a nitride semiconductor having a band gap that is larger than that of the electron transit layer, a gate layer formed on the electron supply layer, the gate layer being formed from a nitride semiconductor including an acceptor impurity and having a band gap that is smaller than that of the electron supply layer, a gate electrode formed on the gate layer; and a source electrode and a drain electrode that are in contact with the electron supply layer. The acceptor impurity includes zinc and magnesium. The zinc has a concentration profile in a thickness-wise direction of the gate layer. The magnesium has a concentration profile in the thickness-wise direction of the gate layer. The concentration profile of the zinc differs from the concentration profile of the magnesium.

This structure facilitates the depletion of the 2DEG in the region immediately below the gate layer as compared to a structure in which the acceptor impurity included in the gate layer is only Mg. As a result, the threshold voltage of the nitride semiconductor device is increased while limiting increases in on-resistance.

Advantageous Effects of Invention

The nitride semiconductor device according to the present disclosure increases the threshold voltage while limiting increases in on-resistance.

DESCRIPTION OF EMBODIMENTS

Figure 1:
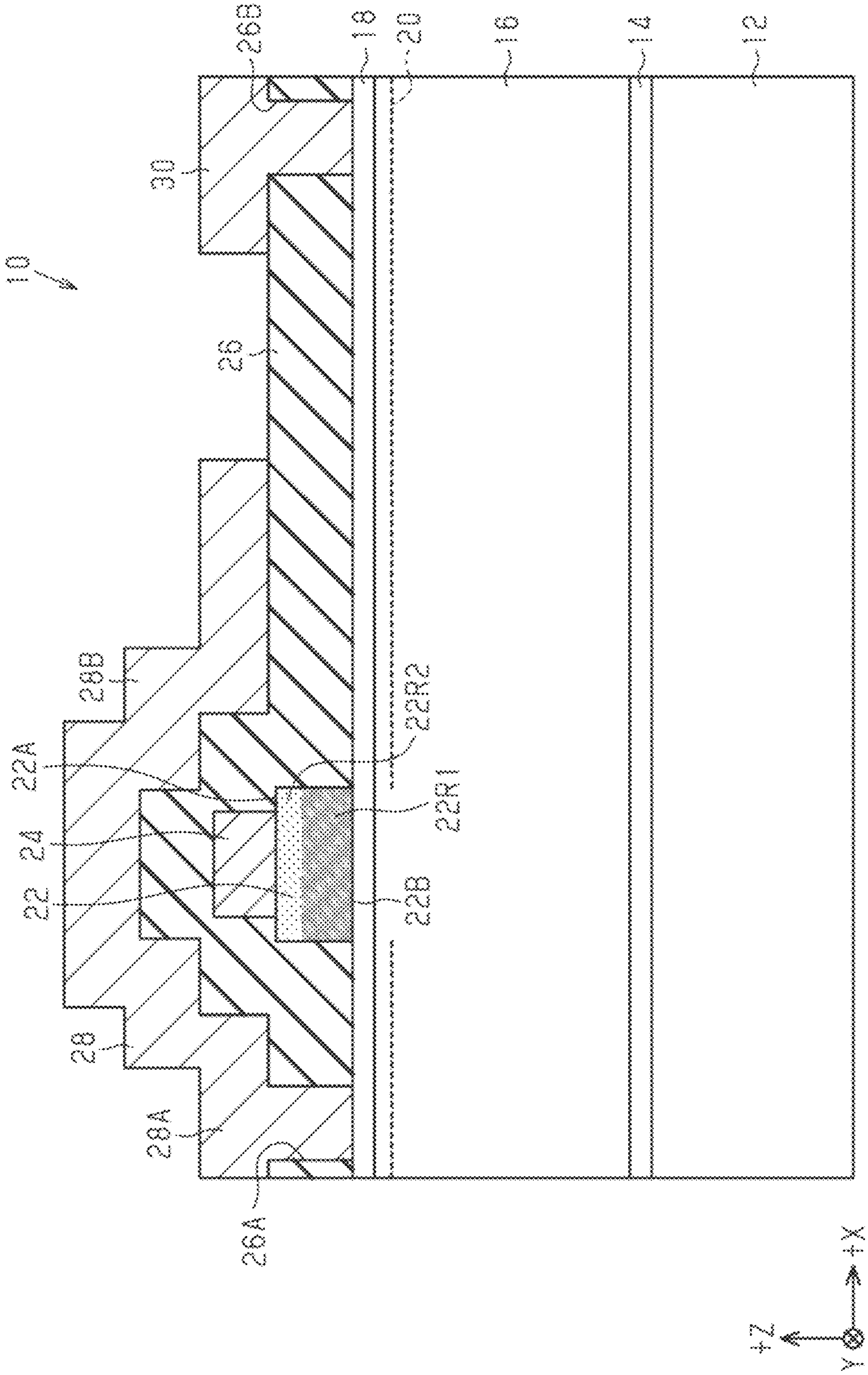
FIG. 1 is a schematic cross-sectional view showing an example of a nitride semiconductor device in a first embodiment.

Embodiments of a nitride semiconductor device according to the present disclosure will be described below with reference to the drawings.

In the drawings, elements may not be drawn to scale for simplicity and clarity of illustration. In a cross-sectional view, hatching may be partially omitted to facilitate understanding. The accompanying drawings only illustrate embodiments of the present disclosure and are not intended to limit the present disclosure.

The following detailed description includes exemplary embodiments of a device, a system, and a method according to the present disclosure. The detailed description is illustrative and is not intended to limit embodiments of the present disclosure or the application and use of the embodiments.

First Embodiment

FIG. 1 is a schematic cross-sectional view showing an example of a nitride semiconductor device 10 in a first embodiment. The term "plan view" used in the present disclosure refers to a view of the nitride semiconductor device 10 in the Z-axis direction when the XYZ-axes are orthogonal to each other as shown in FIG. 1. In the nitride semiconductor device 10 shown in FIG. 1, the +Z direction defines the upper side, the −Z direction defines the lower side, and the +X direction defines the right, and the −X direction defines the left. Unless otherwise specified, "plan view" refers to a view of the nitride semiconductor device 10 taken from above in the Z-axis direction.

The nitride semiconductor device 10 is a high-electron-mobility transistor (HEMT) that uses a nitride semiconductor. The nitride semiconductor device 10 is a normally-off transistor.

The nitride semiconductor device 10 includes a substrate 12, a buffer layer 14 formed on the substrate 12, an electron transit layer 16 formed on the buffer layer 14, and an electron supply layer 18 formed on the electron transit layer 16.

In an example, a silicon (Si) substrate is used as the substrate 12. Alternatively, a silicon carbide (SiC) substrate, a gallium nitride (GaN) substrate, or a sapphire substrate may be used instead of the Si substrate. The thickness of the substrate 12 may be, for example, greater than or equal to 200 μm and less than or equal to 1500 μm.

The buffer layer 14 is disposed between the substrate 12 and the electron transit layer 16 and may be formed from any material that reduces the lattice mismatching between the substrate 12 and the electron transit layer 16. The buffer layer 14 may include one or more nitride semiconductor layers and, for example, at least one of an aluminum nitride (AlN) layer, an aluminum gallium nitride (AlGaN) layer, or a graded AlGaN layer including a different aluminum (Al) composition. In an example, the buffer layer 14 may be formed from a single film of AlN, a single film of AlGaN, a film having a superlattice structure of AlGaN/GaN, a film having a superlattice structure of AlN/AlGaN, or a film having a superlattice structure of AlN/GaN.

In an example, the buffer layer 14 may include a first buffer layer, which is an AlN layer formed on the substrate 12, and a second buffer layer, which is an AlGaN formed on the AlN layer. In an example, the first buffer layer may be an AlN layer having a thickness of approximately 200 nm. In an example, the second buffer layer may be an AlGaN layer having a thickness of approximately 100 nm. To inhibit current leakage from the buffer layer 14, a portion of the buffer layer 14 may be doped with an impurity so that the buffer layer 14 excluding an outer layer region is semi-insulating. In this case, the impurity is, for example, carbon (C) or iron (Fe). The concentration of the impurity may be, for example, greater than or equal to $4\times10^{16}$ $cm^{-3}$.

The electron transit layer 16 is formed from a nitride semiconductor and may be, for example, a GaN layer. The thickness of the electron transit layer 16 may be, for example, greater than or equal to 0.5 μm and less than or equal to 2 μm. To inhibit current leakage from the electron transit layer 16, a portion of the electron transit layer 16 may be doped with an impurity so that the electron transit layer 16 excluding an outer layer region is semi-insulating. In this case, the impurity is, for example, C. The concentration of the impurity is, for example, greater than or equal to $4\times10^{16}$ $cm^{-3}$. More specifically, the electron transit layer 16 may include GaN layers having different impurity concentrations, for example, a C-doped GaN layer and a non-doped GaN layer. In this case, the C-doped GaN layer may be formed on the buffer layer 14 and have a thickness of greater than or equal to 0.5 μm and less than or equal to 2 μm. The C concentration in the C-doped GaN layer may be greater than or equal to $5\times10^{17}$ $cm^{-3}$ and less than or equal to $5\times10^{19}$ $cm^{-3}$. The non-doped GaN layer may be formed on the C-doped GaN layer and have a thickness of greater than or equal to 0.05 μm and less than or equal to 0.3 μm. The non-doped GaN layer is in contact with the electron supply layer 18. In an example, the electron transit layer 16 includes a non-doped GaN layer having a thickness of approximately 0.1 μm and a C-doped GaN layer having a thickness of approximately 0.9 μm. The concentration of C in the C-doped GaN layer is approximately $1\times10^{18}$ $cm^{-3}$.

The electron supply layer 18 is formed from a nitride semiconductor having a band gap that is larger than that of the electron transit layer 16 and may be, for example, an AlGaN layer. In the nitride semiconductor, the band gap becomes larger as the composition of Al is increased. Therefore, the electron supply layer 18, which is an AlGaN layer, has a larger band gap than the electron transit layer 16, which is a GaN layer. In an example, the electron supply layer 18 is formed from $Al_xGa_{1-x}N$, where $0<x<0.4$, and more preferably, $0.1<x<0.3$. The electron supply layer 18 may have a thickness of, for example, greater than or equal to 5 nm and less than or equal to 20 nm.

The electron transit layer 16 and the electron supply layer 18 have different lattice constants in a bulk region. This results in the lattice mismatching between the electron transit layer 16 and the electron supply layer 18. In the vicinity of the heterojunction interface between the electron transit layer 16 and the electron supply layer 18, the energy level of the conduction band of the electron transit layer 16 is lower than the Fermi level due to spontaneous polarization of the electron transit layer 16 and the electron supply layer 18 and piezoelectric polarization caused by compressive stress received by a heterojunction portion of the electron supply layer 18. As a result, at a location close to the heterojunction interface between the electron transit layer 16 and the electron supply layer 18 (e.g., approximately a few nanometers away from the interface), two-dimensional electron gas 20 (2DEG) spreads in the electron transit layer 16.

The nitride semiconductor device 10 further includes a gate layer 22 formed on the electron supply layer 18, a gate electrode 24 formed on the gate layer 22, a passivation layer 26, a source electrode 28, and a drain electrode 30. The source electrode 28 and the drain electrode 30 extend through the passivation layer 26 and are in contact with the electron supply layer 18.

The gate layer 22, formed on the electron supply layer 18, is formed from a nitride semiconductor having a band gap that is smaller than that of the electron supply layer 18 and including an acceptor impurity. The gate layer 22 may be formed from any material having a band gap that is smaller than that of the electron supply layer 18, which is, for example, an AlGaN layer. In an example, the gate layer 22 is a GaN layer (p-type GaN layer) doped with an acceptor impurity. The gate layer 22 may have, for example, a thickness of greater than or equal to 80 nm and less than or equal to 150 nm and have a cross section that is rectangular, trapezoidal, or, ridged.

The gate layer 22 includes an upper surface 22A (first surface), which is in contact with the gate electrode 24, and a bottom surface 22B (second surface) opposite to the upper surface 22A in the thickness-wise direction of the gate layer 22. In the present embodiment, the bottom surface 22B is in contact with the electron supply layer 18. The upper surface 22A and the bottom surface 22B intersect with the thickness-wise direction of the gate layer 22 (Z-direction in FIG. 1) and, in the present embodiment, are orthogonal to the thickness-wise direction of the gate layer 22.

The gate layer 22 may include at least two acceptor impurities. In an example, the acceptor impurities include zinc (Zn) and magnesium (Mg). The concentration profile of Zn in the thickness-wise direction of the gate layer 22 differs from the concentration profile of Mg in the thickness-wise direction of the gate layer 22.

The depth $E_t$-$E_v$ of the acceptor level from the valence band in GaN doped with Mg is approximately 0.2 eV. The depth $E_t$-$E_v$ of the acceptor level from the valence band in GaN doped with Zn is approximately 0.3 eV. Hence, any of Mg and Zn may be used as a dopant to obtain a p-type GaN layer.

In an example, the maximum concentration of Zn in the gate layer 22 is greater than or equal to $1\times10^{18}$ $cm^{-3}$ and less than or equal to $2\times10^{19}$ $cm^{-3}$. In an example, the maximum concentration of Mg in the gate layer 22 is greater than or equal to $1\times10^{19}$ $cm^{-3}$ and less than or equal to $2\times10^{19}$ $cm^{3}$.

As described above, the acceptor impurities included in the gate layer 22 increase the energy levels of the electron transit layer 16 and the electron supply layer 18. As a result, in a region immediately below the gate layer 22, the energy level of the conduction band of the electron transit layer 16 in the vicinity of the heterojunction interface between the electron transit layer 16 and the electron supply layer 18 is substantially equal to or greater than the Fermi level. Therefore, when no voltage is applied to the gate electrode 24, that is, in the zero bias state, the 2DEG 20 is not formed in the electron transit layer 16 in the region immediately below the gate layer 22. On the other hand, in a region other than the region immediately below the gate layer 22, the 2DEG 20 is formed in the electron transit layer 16.

As described above, when the gate layer 22 is doped with the acceptor impurities, the 2DEG 20 is depleted in the region immediately below the gate layer 22. As a result, the nitride semiconductor device 10 performs a normally-off operation. When an appropriate on-voltage is applied to the gate electrode 24, the 2DEG 20 forms a channel in the electron transit layer 16 in the region immediately below the gate electrode 24. This electrically connects the source and the drain.

The gate electrode 24 is formed on the gate layer 22. In FIG. 1, the gate electrode 24 is formed on a portion of the upper surface 22A of the gate layer 22. Alternatively, the gate electrode 24 may be formed on the entire upper surface 22A of the gate layer 22 or may extend from the upper surface 22A to a portion of a side surface of the gate layer 22. The gate electrode 24 is formed from one or more metal layers, which is, for example, a titanium nitride (TiN) layer. Alternatively, the gate electrode 24 may include a first metal layer formed from Ti and a second metal layer formed from TiN and disposed on the first metal layer. The thickness of the gate electrode 24 may be, for example, greater than or equal to 50 nm and less than or equal to 200 nm. The gate electrode 24 may form a Schottky junction with the gate layer 22.

The passivation layer 26 covers the electron supply layer 18, the gate layer 22, and the gate electrode 24. The passivation layer 26 may be formed from, for example, any one of a silicon nitride (SiN) layer, a silicon dioxide ($SiO_2$) layer, a silicon oxynitride (SiON) layer, an alumina ($Al_2O_3$) layer, an AlN layer, and an aluminum oxynitride (AlON) layer, or any combination of two or more of these. In an example, the passivation layer 26 may be a SiN layer. The passivation layer 26 may directly cover a portion of the upper surface of the electron supply layer 18, a side surface and the upper surface 22A of the gate layer 22, and a side surface and an upper surface of the gate electrode 24.

The passivation layer 26 includes a source contact hole 26A and a drain contact hole 26B. The source electrode 28 and the drain electrode 30 are in ohmic contact with the electron supply layer 18 by the source contact hole 26A and the drain contact hole 26B, respectively. The source contact hole 26A and the drain contact hole 26B are separated from the gate layer 22.

The source electrode 28 and the drain electrode 30 are formed from one or more metal layers (e.g., Ti, Al, TiN). The source electrode 28 includes a source electrode portion 28A and a source field plate 28B continuous with the source electrode portion 28A.

The source electrode portion 28A includes a filling region that fills the source contact hole 26A and an upper region that is formed integrally with the filling region. In plan view, the upper region is located around the source contact hole 26A and above the gate electrode 24. The source field plate 28B is formed integrally with the upper region of the source electrode portion 28A and is disposed on the passivation layer 26 to extend from an end of the gate layer 22 toward the drain electrode 30 in plan view. When no gate voltage is applied to the gate electrode 24, that is, in the zero bias state, the source field plate 28B extends a depletion layer in the region immediately below the source field plate 28B to reduce the concentration of electric field in the vicinity of the end of the gate electrode 24.

The concentration profile of the acceptor impurities in the gate layer 22 of the present embodiment will now be described with reference to FIGS. 1 and 2.

As shown in FIG. 1, the gate layer 22 may include a first region 22R1 and a second region 22R2. However, there is no physical boundary between the first region 22R1 and the second region 22R2. The first region 22R1 and the second region 22R2 are located adjacent to each other and arranged in the thickness-wise direction of the gate layer 22. More specifically, the gate layer 22 includes the first region 22R1 and the second region 22R2 that are arranged in order from the lower side in the thickness-wise direction. Thus, the first region 22R1 may be referred to as the lowermost region of the gate layer 22.

The first region 22R1 includes the bottom surface 22B and is in contact with the electron supply layer 18. In the first region 22R1, the concentration of Zn is higher than the concentration of Mg.

The second region 22R2 is located adjacent to the first region 22R1 in the thickness-wise direction of the gate layer 22. In the present embodiment, the gate layer 22 has a two-layer structure in which the second region 22R2 is formed on the first region 22R1. Thus, in the present embodiment, the second region 22R2 includes the upper surface 22A.

In the second region 22R2, the concentration of Mg is higher than or equal to the concentration of Zn. More specifically, the gate layer 22 of the present embodiment includes a two-layer structure including the first region 22R1, in which the concentration of Zn is relatively high, and the second region 22R2, in which the concentration of Mg is relatively high.

The first region 22R1 may be greater in thickness than the second region 22R2. Alternatively, the first region 22R1 and the second region 22R2 may be equal in thickness. The first region 22R1 may be smaller in thickness than the second region 22R2.

The first region 22R1 and the second region 22R2 of the gate layer 22 described above are formed because the concentration profile of Zn has a steeper increase than the concentration profile of Mg in the vicinity of the bottom surface 22B of the gate layer 22. The concentration profiles of Zn and Mg will be described with reference to FIG. 2.

Figure 2:
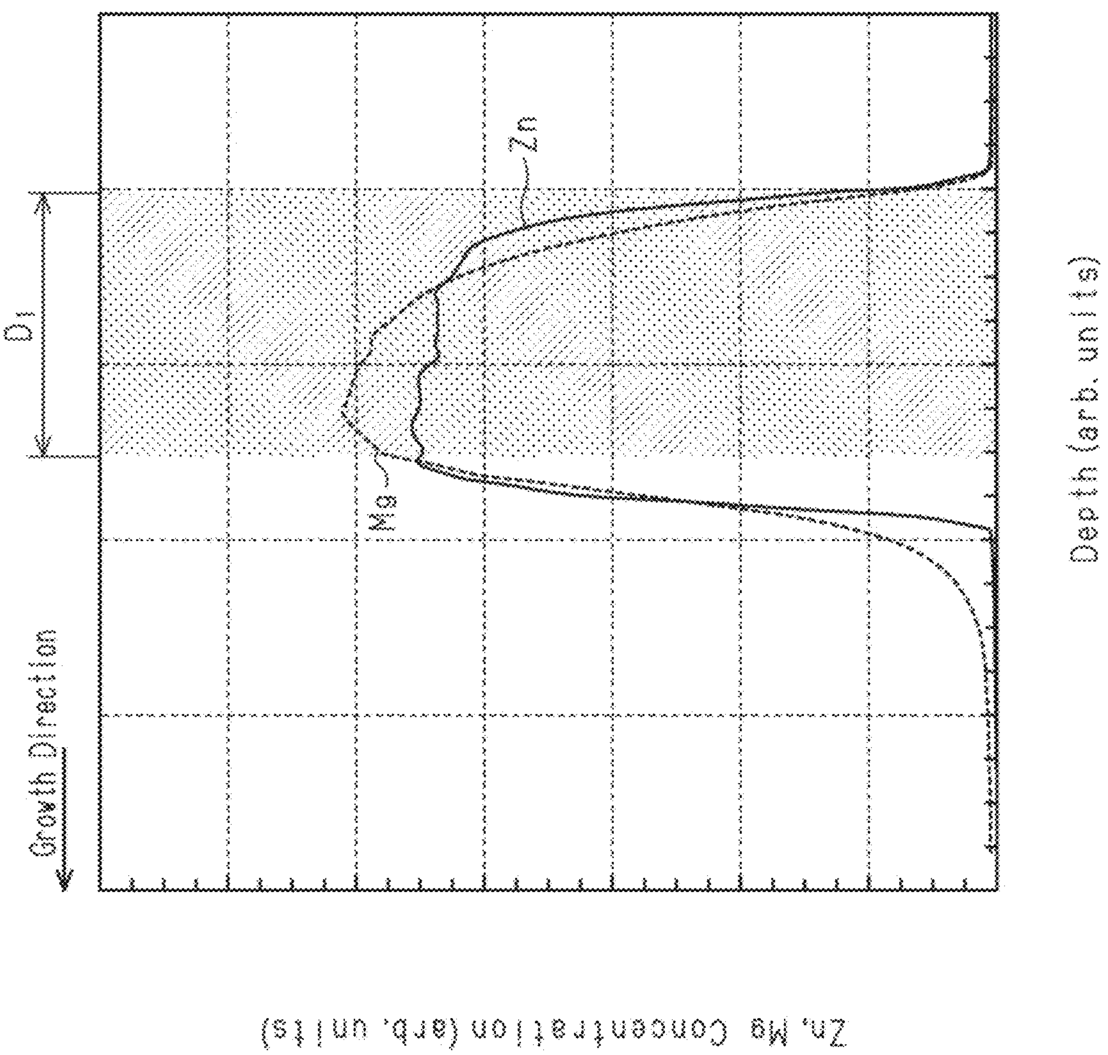
FIG. 2 is a graph showing concentration profiles of zinc and magnesium that are doped in a portion of a gallium nitride layer.

FIG. 2 shows the concentration profiles of Zn and Mg that are doped in a portion of a GaN layer. The concentrations of Zn and Mg may be measured using secondary ion mass spectrometry. In the graph shown in FIG. 2, the horizontal axis represents the depth of the GaN layer, and the direction from the right to the left of the horizontal axis refers to a growth direction of the GaN layer. The vertical axis of the graph represents the concentrations of Zn and Mg. In the graph, the concentration of Zn is indicated by a solid line, and the concentration of Mg is indicated by a broken line.

A doped region $D_1$ (in the graph shown in FIG. 2, the region with dot hatching) indicates a region where a doping gas of Zn or Mg is supplied during continuous growth of the GaN layer. It shows that while the GaN layer is growing, the supply of each doping gas starts at the right end of the doped region $D_1$ shown in FIG. 2 and stops at the left end of the doped region $D_1$. In the graph shown in FIG. 2, the result of measurement of a sample in which the GaN layer is partially doped with only Zn is superimposed on the result of measurement of a sample in which the GaN layer is partially doped with only Mg.

In the samples having the measurement results shown in FIG. 2, even after the supply of the doping gas is stopped, the GaN layer continues to grow. However, when forming the gate layer 22 in the nitride semiconductor device 10, the supply of the doping gas and the supply of a material gas of the GaN layer forming the gate layer 22 may be substantially simultaneously stopped.

Comparison of the concentration profile of Zn with the concentration profile of Mg shows that the concentration of Zn is increased and decreased more steeply than the concentration of Mg. This may be due to a delay phenomenon, that is, even when the doping gas of Mg is supplied to a growth chamber, Mg is not immediately drawn into the growing layer, and a memory effect, that is, even when the supply of the gas is stopped, the residual Mg in the chamber is doped unintentionally. The doping with Zn is less affected by the delay phenomenon and the memory effect than the doping with Mg. Thus, Zn has a concentration profile having a steeper increase and a steeper decrease than Mg.

Also, when the gate layer 22 is co-doped with Zn and Mg, the concentration profiles of Zn and Mg in the thickness-wise direction of the gate layer 22 have increases as shown in FIG. 2. Therefore, due to the difference in the concentration profile between Zn and Mg as described above, in the gate layer 22 of the present embodiment, the concentration of Zn is higher than the concentration of Mg in the first region 22R1, which is in contact with the electron supply layer 18. The concentration of Mg is higher than or equal to the concentration of Zn in the second region 22R2.

As shown in the concentration profiles of Zn and Mg, the concentrations of Zn and Mg change in accordance with the thickness-wise direction of the gate layer 22. The maximum concentration of each of Zn and Mg is the concentration that is highest in the thickness-wise direction of the gate layer 22.

An example of a method for manufacturing the nitride semiconductor device 10 will be briefly described.

In an example, metalorganic chemical vapor deposition (hereafter, referred to as MOCVD) is used to epitaxially grow an AlN layer and an AlGaN layer (corresponding to the buffer layer 14), a GaN layer (corresponding to the electron transit layer 16), an AlGaN layer (corresponding to the electron supply layer 18), and a p-type GaN layer (corresponding to the gate layer 22) on the substrate 12, which is a Si substrate. The layers described above are formed from nitride semiconductors having lattice constants relatively close to each other. This allows for sequential epitaxial growth of the layers.

While a desired layer is epitaxially growing, a doping gas is supplied to the growth chamber so that the layer is doped with an impurity. Examples of the doping gas include biscyclopentadienyl magnesium ($Cp_2Mg$) for doping with Mg and dimethylzinc (DMZn) for doping with Zn.

In the method for manufacturing the nitride semiconductor device 10, the GaN layer, which corresponds to the gate layer 22, is doped with acceptor impurities. In an example, the acceptor impurities include Zn and Mg. Thus, while the GaN layer corresponding to the gate layer 22 is growing, DMZn and $Cp_2Mg$ are supplied to the chamber to form a p-type GaN layer that is doped with Zn and Mg.

In the concentration profiles shown in FIG. 2, the maximum concentration of Zn is lower than the maximum concentration of Mg. However, the concentration of Zn may be increased depending on the process condition. The concentration of Zn may be changed, for example, by controlling the flow rate of a Zn doping gas or the growth temperature of the GaN layer. However, increases in the concentration of Zn are limited because the vapor pressure of DMZn is high, there is a device-related limitation on increases in the supply amount of the doping gas, and a change in the growth temperature may increase other undesirable impurities such as carbon (C). As compared to Zn, increases in the concentration of Mg are relatively easy even though Mg has the delay phenomenon and the memory effect. Therefore, Zn, which has a concentration profile having a steep increase and a steep decrease, is combined with Mg, which can have a higher concentration than Zn. This forms a GaN layer (p-type GaN layer) that is doped with the impurities having a desired concentration profile overall.

Subsequent to the formation of the p-type GaN layer doped with Zn and Mg, a metal layer is formed on the p-type GaN layer. The p-type GaN layer and the metal layer are patterned by lithography and etching to form the gate layer 22 and the gate electrode 24. Then, the passivation layer 26 is formed to entirely cover the exposed surfaces of the electron supply layer 18, the gate layer 22, and the gate electrode 24. The source contact hole 26A and the drain contact hole 26B are formed in the passivation layer 26 to extend through the passivation layer 26. Then, a metal layer is formed to fill the source contact hole 26A and the drain contact hole 26B and entirely cover the exposed surface of the passivation layer 26. The metal layer is patterned by lithography and etching to form the source electrode 28 and the drain electrode 30. As a result, the nitride semiconductor device 10 shown in FIG. 1 is obtained.

The operation of the present embodiment will be described below.

The gate layer 22 is doped with the acceptor impurities including Zn and Mg. The concentration profile of Zn in the thickness-wise direction of the gate layer 22 differs from the concentration profile of Mg in the thickness-wise direction of the gate layer 22. In the example shown in FIG. 1, the concentration of Zn is higher than the concentration of Mg in the first region 22R1 including the bottom surface 22B of the gate layer 22. Thus, in the vicinity of the bottom surface 22B, the concentration of the acceptor impurities in the gate layer 22 is higher than that when only Mg is used as the acceptor impurity.

In the second region 22R2 of the gate layer 22, which is adjacent to the first region 22R1, the concentration of Mg is higher than or equal to the concentration of Zn. Thus, the gate layer 22 includes overall a greater amount of the acceptor impurities than when only Zn is used as the acceptor impurity.

As described above, when the gate layer 22 includes Zn and Mg as the acceptor impurity, the depletion of the 2DEG 20 is facilitated in the region immediately below the gate layer 22. This increases the threshold voltage of the nitride semiconductor device 10. In particular, the threshold voltage is increased effectively when the gate layer 22 includes a higher concentration of the acceptor impurity in the first region 22R1 of the gate layer 22, which is located relatively close to the 2DEG 20.

The operation characteristics of the nitride semiconductor device 10 will now be described.

Figure 3:
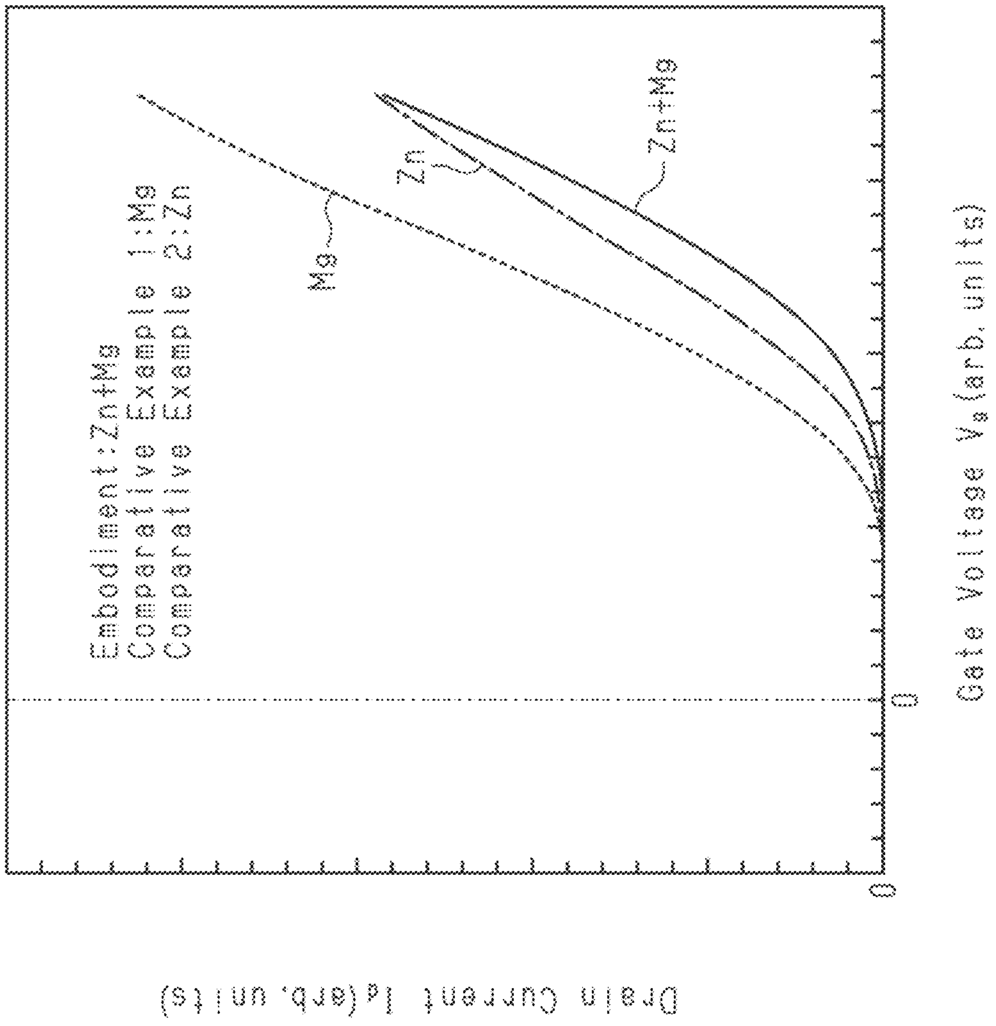
FIG. 3 is a graph showing the drain current $I_d$-gate voltage $V_g$ characteristics of nitride semiconductor devices in an embodiment and two comparative examples.
Figure 4:
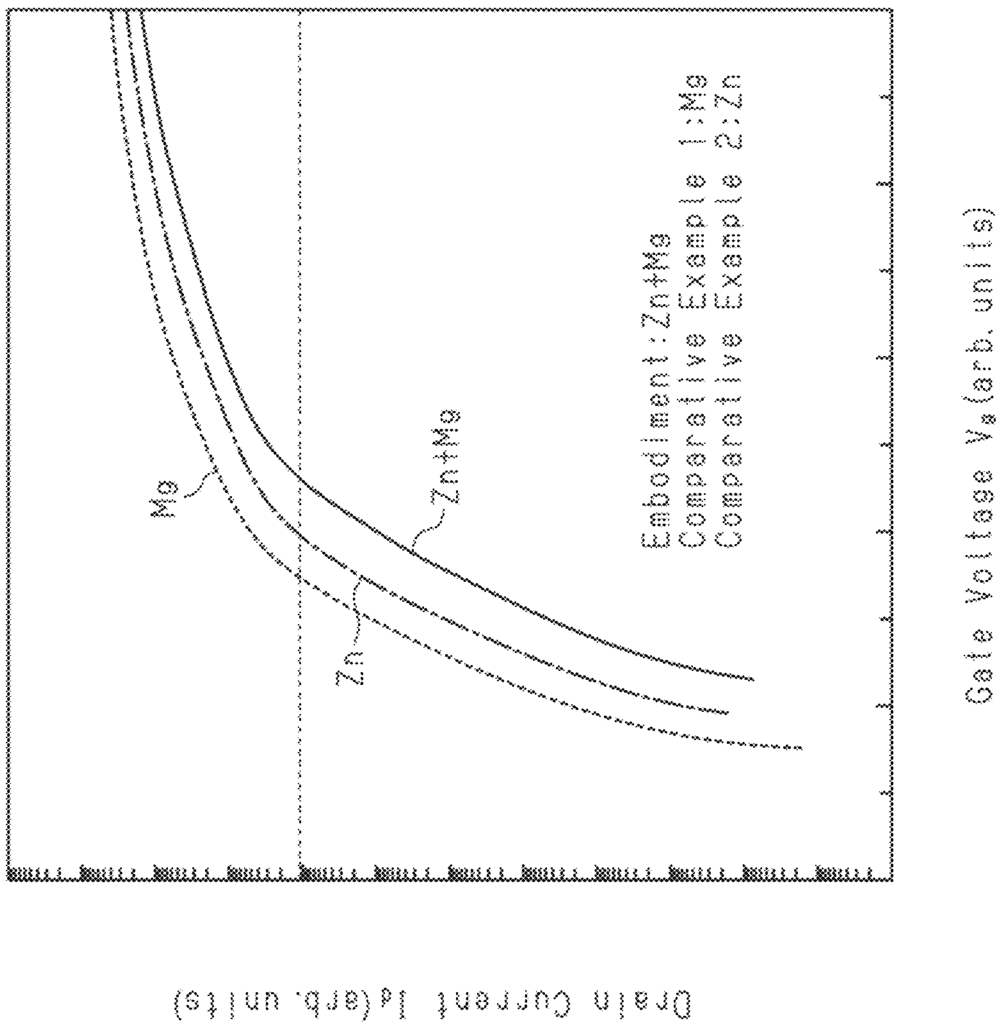
FIG. 4 is a graph showing the drain current $I_d$-gate voltage $V_g$ characteristics of nitride semiconductor devices in an embodiment and two comparative examples.

FIGS. 3 and 4 show the drain current $I_d$-gate voltage $V_g$ characteristics (hereafter, $I_d$-$V_g$ characteristics) of an embodiment and two comparative examples of nitride semiconductor devices.

The embodiment of the nitride semiconductor device may correspond to the nitride semiconductor device 10 shown in FIG. 1, which includes the gate layer 22 doped with Zn and Mg as the acceptor impurity. In comparative example 1, the gate layer is doped with only Mg. In comparative example 2, the gate layer is doped with only Zn. The nitride semiconductor devices of the embodiment, comparative example 1, and comparative example 2 are equivalent to each other except for the type of acceptor impurity being a dopant in the gate layer. In FIGS. 3 and 4, the $I_d$-$V_g$ characteristics of the nitride semiconductor devices of the embodiment, comparative example 1, and comparative example 2 are indicated by solid lines, broken lines, and single-dashed lines, respectively.

FIG. 3 is a linear scale graph showing the $I_d$-$V_g$ characteristics of the nitride semiconductor devices of the embodiment, comparative example 1, and comparative example 2. As shown in FIG. 3, when the gate voltage $V_g$ is 0 V, the drain current $I_d$ is approximately zero in the embodiment, comparative example 1, and comparative example 2. Therefore, the nitride semiconductor devices of the embodiment, comparative example 1, and comparative example 2 each operate as a normally-off transistor.

FIG. 4 is a logarithmic scale graph showing the $I_d$-$V_g$ characteristics of the nitride semiconductor devices of the embodiment, comparative example 1, and comparative example 2. In FIG. 4, the gate voltage $V_g$ corresponding to the predetermined drain current $I_d$ indicated by the horizontal broken line is defined as the threshold voltage. As shown in FIG. 4, the nitride semiconductor device of comparative example 2 in which the gate layer is doped with Zn has a higher threshold voltage than the nitride semiconductor device of comparative example 1 in which the gate layer is doped with Mg. Thus, the threshold voltage is increased by using Zn, which has a concentration profile having a relatively steep increase in the vicinity of the bottom surface of the gate layer, as the dopant in the gate layer instead of Mg, which is relatively greatly affected by the delay phenomenon and the memory effect. Moreover, the nitride semiconductor device of the embodiment in which the gate layer is doped with Zn and Mg has an even higher threshold voltage than the nitride semiconductor device of comparative example 2 in which the gate layer is doped with Zn. Thus, the threshold voltage is further increased by doping the gate layer with the combination of Zn, having the concentration profile having a relatively steep increase in the vicinity of the bottom surface of the gate layer, and Mg, which can have a higher concentration than Zn in the gate layer.

The first embodiment has the following advantages.

(1-1) The nitride semiconductor device 10 includes the gate layer 22 that is formed on the electron supply layer 18 and includes a nitride semiconductor having a smaller band gap than the electron supply layer 18 and including acceptor impurities. The acceptor impurities include Zn and Mg. The concentration profile of Zn in the thickness-wise direction of the gate layer 22 differs from the concentration profile of Mg in the thickness-wise direction of the gate layer 22.

This structure facilitates the depletion of the 2DEG 20 in the region immediately below the gate layer 22 as compared to a structure in which the acceptor impurity included in the gate layer 22 is only Mg. As a result, the threshold voltage of the nitride semiconductor device 10 is increased while limiting increases in on-resistance.

(1-2) The maximum concentration of Zn in the gate layer 22 is greater than or equal to $1\times10^{18}$ $cm^{-3}$ and less than or equal to $2\times10^{19}$ $cm^{-3}$. The maximum concentration of Mg in the gate layer 22 is greater than or equal to $1\times10^{19}$ $cm^{-3}$ and less than or equal to $2\times10^{19}$ $cm^{-3}$.

In this structure, since the concentration of Zn and the concentration of Mg included in the gate layer 22 are both relatively high, the depletion of the 2DEG 20 is facilitated in the region immediately below the gate layer 22. As a result, the threshold voltage of the nitride semiconductor device 10 is increased while limiting increases in on-resistance.

(1-3) The concentration of Zn is higher than the concentration of Mg in the first region 22R1 including the bottom surface 22B of the gate layer 22.

In this structure, the gate layer 22 includes Zn, which has a concentration profile having a steep increase, in the first region 22R1. This allows the gate layer 22 to have an even higher concentration of the acceptor impurities in the vicinity of the bottom surface 22B. This facilitates the depletion of the 2DEG 20 in the region immediately below the gate layer 22. As a result, the threshold voltage of the nitride semiconductor device 10 is increased while limiting increases in on-resistance.

(1-4) In the second region 22R2, which is adjacent to the first region 22R1 in the thickness-wise direction of the gate layer 22, the concentration of Mg is higher than or equal to than the concentration of Zn.

In this structure, the gate layer 22 includes Mg, which can have a higher concentration than Zn, in the second region 22R2. This allows the gate layer 22 to include, overall, a greater amount of the acceptor impurities. This facilitates the depletion of the 2DEG 20 in the region immediately below the gate layer 22. As a result, the threshold voltage of the nitride semiconductor device 10 is increased while limiting increases in on-resistance.

(1-5) In the gate layer 22, the first region 22R1 is greater in thickness than the second region 22R2.

This structure allows the gate layer 22 to include a greater amount of Zn, which has a concentration profile having a relatively steep increase, in the vicinity of the bottom surface 22B of the gate layer 22. This facilitates the depletion of the 2DEG 20 in the region immediately below the gate layer 22. As a result, the threshold voltage of the nitride semiconductor device 10 is increased while limiting increases in on-resistance.

Modified Example of First Embodiment

The first embodiment may be modified as follows.

Figure 5:
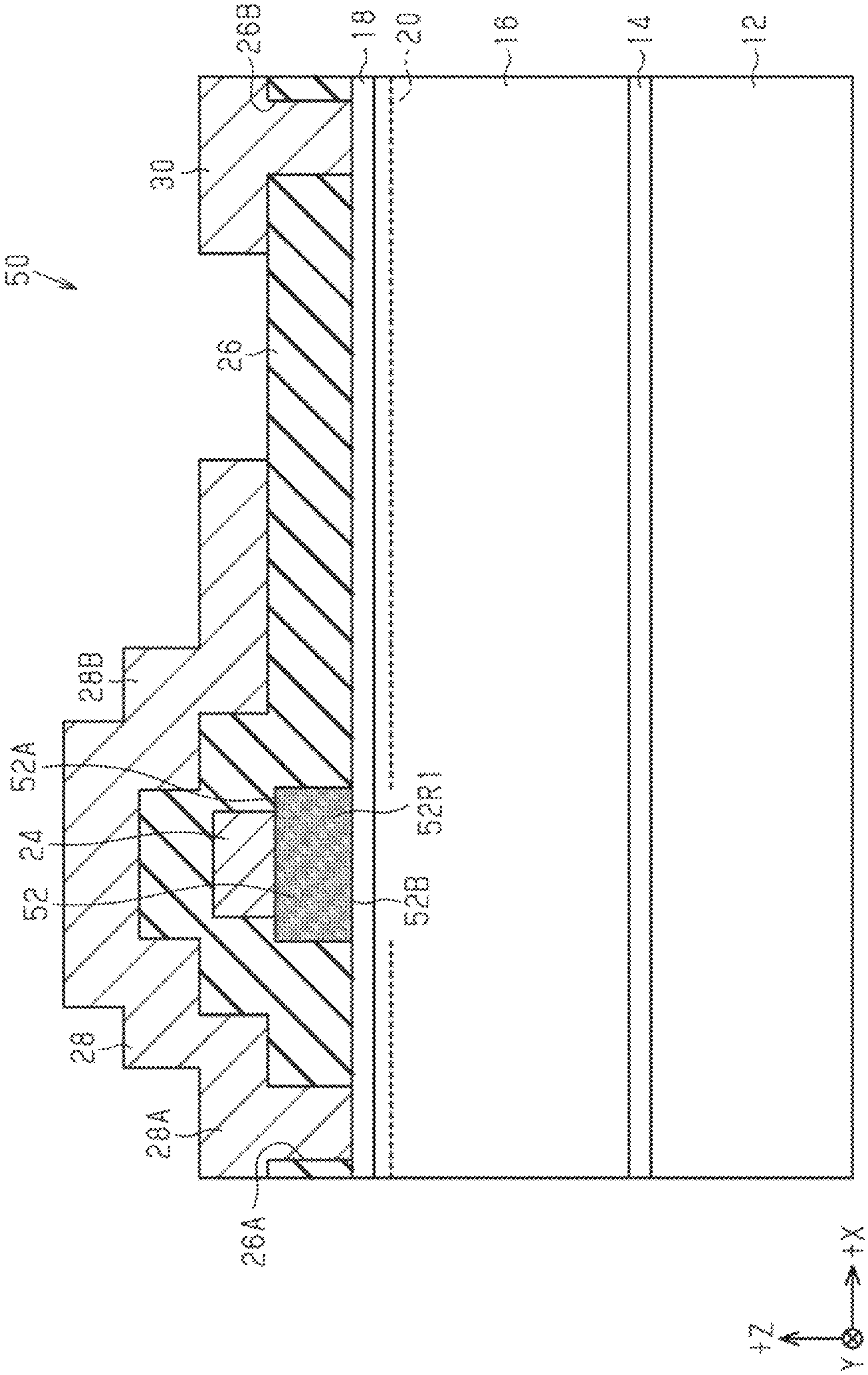
FIG. 5 is a schematic cross-sectional view showing an example of a nitride semiconductor device in a modified example of the first embodiment.

FIG. 5 is a schematic cross-sectional view showing an example of a nitride semiconductor device 50 in a modified example of the first embodiment. The nitride semiconductor device 50 differs from the nitride semiconductor device 10 of the first embodiment in that a gate layer 52 includes only a region 52R1 in which the concentration of Mg is higher than the concentration of Zn. In the nitride semiconductor device 10 of the first embodiment, the gate layer 22 has a two-layer structure including the first region 22R1, in which the concentration of Zn is relatively high, and the second region 22R2, in which the concentration of Mg is relatively high. In the nitride semiconductor device 50 of the modified example, the gate layer 52 has a single-layer structure including the region 52R1, in which the concentration of Mg is relatively high. In other words, in the nitride semiconductor device 50, the concentration of Mg is higher than the concentration of Zn in the entire region of the gate layer 52. In this case, the region 52R1 includes an upper surface 52A (first surface) and a bottom surface 52B (second surface). The maximum concentration of Mg in the gate layer 52 may be at least twice the maximum concentration of Zn.

Figure 6:
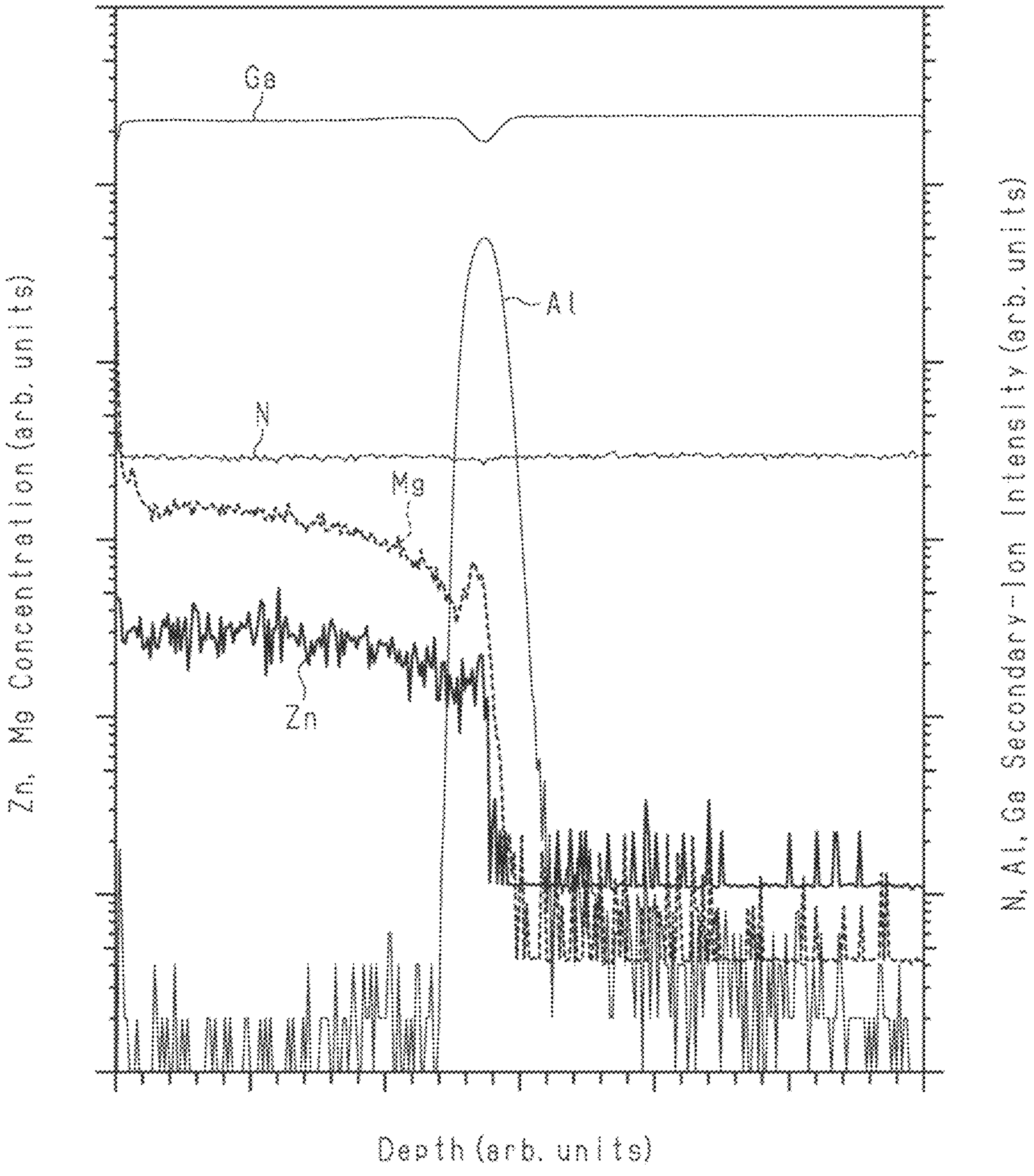
FIG. 6 is a graph showing concentration profiles of zinc and magnesium that are co-doped in a gallium nitride layer corresponding to a gate layer in a modified example of a nitride semiconductor device.

FIG. 6 shows concentration profiles of Zn and Mg in a sample in which a GaN layer that corresponds to the electron transit layer 16, an AlGaN layer that corresponds to the electron supply layer 18, and a GaN layer that corresponds to the gate layer 52 are stacked in order. In this sample, the GaN layer that corresponds to the gate layer 52 is co-doped with Zn and Mg. In the graph shown in FIG. 6, the region locally having a high secondary-ion intensity of Al corresponds to the AlGaN layer, which corresponds to the electron supply layer 18.

The concentrations of Zn and Mg may be measured using secondary ion mass spectrometry. The horizontal axis of the graph shown in FIG. 6 represents the depth of a measurement sample. The left end of the horizontal axis corresponds to the position of the upper surface of the GaN layer (corresponding to the upper surface 52A of the gate layer 52). The vertical axis at the left side of the graph represents the concentrations of Zn and Mg in a logarithmic scale. The vertical axis at the right side of the graph represents the secondary-ion intensity of N, Al, and Ga. In the graph, the concentration of Zn is indicated by a solid line, and the concentration of Mg is indicated by a broken line. The values of the concentrations of Zn and Mg are quantified by a GaN standard sample and are applicable to only the GaN layer. The concentration of the sample in the surface and the vicinity of the interface may differ from the actual concentration due to the effect of the surface roughness of the sample.

The GaN layer that corresponds to the electron transit layer 16 is not doped with Zn and Mg. Thus, the concentration of each of Zn and Mg is at a background level. In contrast, the GaN layer that corresponds to the gate layer 52 is co-doped with Zn and Mg. Thus, the concentration of each of Zn and Mg is greater than the background level. The concentration of Mg is higher than the concentration of Zn in any position in the thickness-wise direction of the GaN layer corresponding to the gate layer 52.

The concentration profile of Zn in the thickness-wise direction of the GaN layer corresponding to the gate layer 52 differs from the concentration profile of Mg in the thickness-wise direction of the GaN layer corresponding to the gate layer 52. In an example, the concentration of Mg is approximately five times the concentration of Zn at an approximately middle position between the upper surface and the bottom surface of the GaN layer corresponding to the gate layer 52 (corresponding to an approximately middle position between the upper surface 52A and the bottom surface 52B of the gate layer 52). In the GaN layer corresponding to the gate layer 52, the concentration of Mg is approximately two to three times the concentration of Zn at a position close to the interface with the AlGaN layer (corresponding to the vicinity of the bottom surface 52B of the gate layer 52). In other words, in the GaN layer corresponding to the gate layer 52, the difference between the concentration of Mg and the concentration of Zn decreases as the interface with the AlGaN layer corresponding to the electron supply layer 18 becomes closer.

The proportion of Zn in the acceptor impurity included in the GaN layer corresponding to the gate layer 52 changes in the thickness-wise direction of the GaN layer. More specifically, the proportion of Zn increases as the interface with the AlGaN layer (corresponding to the bottom surface 52B of the gate layer 52) becomes closer. As in the description related to FIG. 2 above, this may be because the delay phenomenon that occurs during the doping with Mg is less likely to occur during the doping with Zn.

As shown in FIG. 2, when the maximum concentration of Zn is relatively close to the maximum concentration of Mg, the concentration of Zn, which relatively quickly increases, and the concentration of Mg, which relatively slowly increases, are inverted in the GaN layer. As a result, in the nitride semiconductor device 10 of the first embodiment, the gate layer 22 includes the first region 22R1, in which the concentration of Zn is relatively high, and the second region 22R2, in which the concentration of Mg is relatively high. In contrast, when the maximum concentration of Mg is sufficiently greater than (e.g., at least twice) the maximum concentration of Zn, the inversion of the concentration of Zn and the concentration of Mg does not occur in the GaN layer. As shown in FIG. 6, when the maximum concentration of Mg is approximately five times the maximum concentration of Zn, the concentration of Zn will not exceed the concentration of Mg. In the nitride semiconductor device 50 of the modified example, the gate layer 52 is co-doped with Zn and Mg, each of which has a concentration profile similar to that shown in FIG. 6. Thus, the gate layer 52 includes only the region 52R1, in which the concentration of Mg is relatively high.

The method for manufacturing the nitride semiconductor device 50 of the modified example is substantially the same as that of the first embodiment. The conditions for growing the gate layer 52, including the flow rate of $Cp_2Mg$ and the growth temperature, are selected so that the concentration of Mg will be higher than the concentration of Zn in the gate layer 52.

As described above, in this modified example, the concentration of Mg is higher than the concentration of Zn in the entire region of the gate layer 52. In the gate layer 52, the maximum concentration of Mg is at least twice the maximum concentration of Zn.

In this configuration, the gate layer 52 includes a relatively high concentration of Mg. In addition, although the concentration of Zn does not exceed the concentration of Mg, Zn at least partially compensates for the low concentration of Mg in the vicinity of the bottom surface 52B of the gate layer 52. Thus, particularly in the vicinity of the bottom surface 52B of the gate layer 52, the concentration of the acceptor impurities in the gate layer 52 is higher than when the acceptor impurity is only Mg. This facilitates the depletion of the 2DEG 20 in the region immediately below the gate layer 52. As a result, the threshold voltage of the nitride semiconductor device 50 is increased while limiting increases in on-resistance. In the same manner as the nitride semiconductor device 10, the nitride semiconductor device 50 has a higher threshold voltage than the nitride semiconductor devices of comparative example 1 (doped with Mg) and semiconductor device 2 (doped with Zn) shown in FIGS. 3 and 4.

Second Embodiment

A second embodiment of a nitride semiconductor device 100 will now be described. The nitride semiconductor device 10 of the first embodiment is an HEMT. The nitride semiconductor device 100 of the second embodiment is a light emitting element.

In a light-emitting element using a nitride semiconductor, arrangement of an electron blocking layer on an active layer is a known technique for limiting the outflow of electrons, thereby increasing the recombination efficiency of electrons and holes. The electron blocking layer may be a p-type AlGaN layer doped with Mg.

To further increase the luminance of such a light emitting element, there is a need for a technique that improves the efficiency of the electron blocking layer for limiting the outflow of electrons from the active layer, thereby improving the light emitting efficiency.

Figure 7:
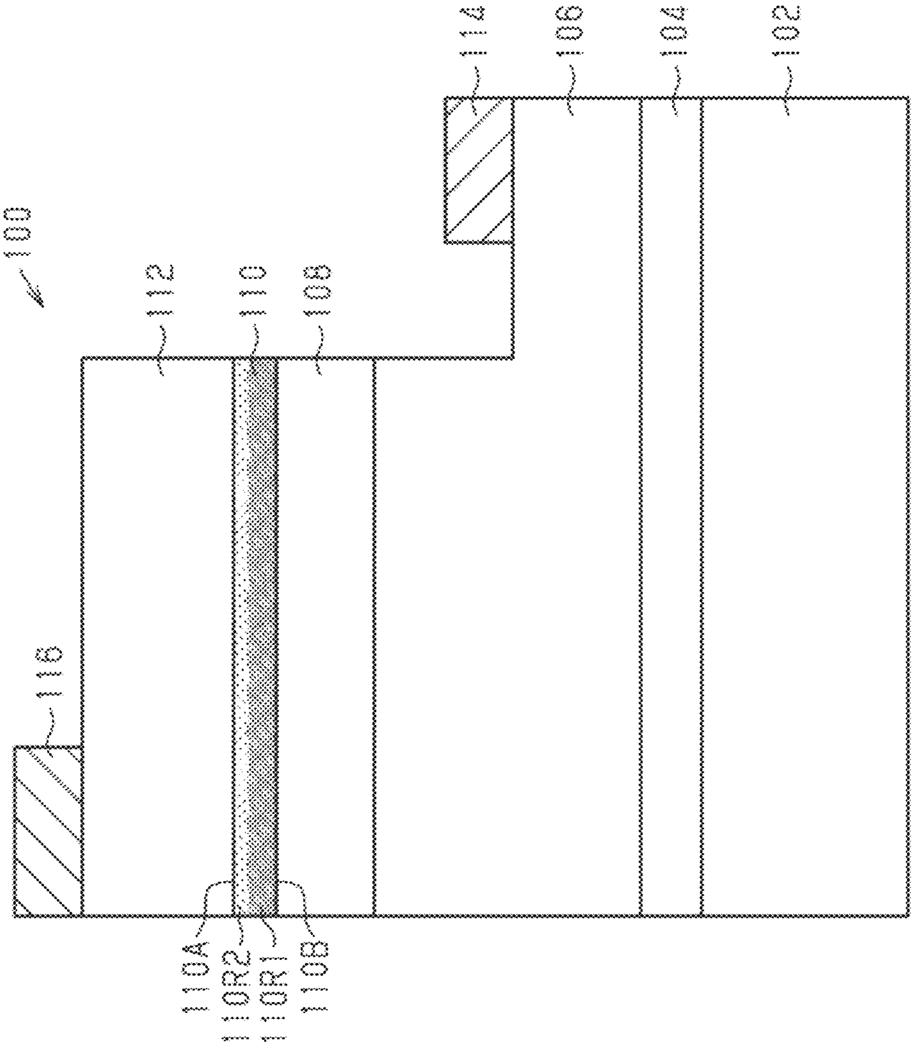
FIG. 7 is a schematic cross-sectional view showing an example of a nitride semiconductor device in a second embodiment.

FIG. 7 is a schematic cross-sectional view showing an example of the nitride semiconductor device 100 in the second embodiment.

The nitride semiconductor device 100 is a light emitting diode (LED) that uses a nitride semiconductor. The nitride semiconductor device 100 includes a substrate 102, a buffer layer 104 formed on the substrate 102, a first contact layer 106 formed on the buffer layer 104, an active layer 108 formed on the first contact layer 106 and having a quantum well structure, an electron blocking layer 110 formed on the active layer 108 and formed from a nitride semiconductor including an acceptor impurity, and a second contact layer 112 formed on the electron blocking layer 110. The nitride semiconductor device 100 further includes a first electrode 114 formed on an exposed surface of the first contact layer 106 and a second electrode 116 formed on the second contact layer 112. The first contact layer 106 and the second contact layer 112 of the second embodiment may also be referred to as a first nitride semiconductor layer and a second nitride semiconductor layer.

In an example, the substrate 102 is a sapphire substrate. Alternatively, the substrate 102 may be a GaN substrate. The buffer layer 104 is disposed between the substrate 102 and the first contact layer 106 and may be formed from any material that reduces the lattice mismatching between the substrate 102 and the first contact layer 106. In an example, the buffer layer 104 may be an AlN layer. In another example, the buffer layer 104 may be a GaN layer grown at a relatively low temperature of greater than or equal to 500° C. and less than or equal to 600° C. The buffer layer 104 may have a thickness of greater than or equal to 100 nm and less than or equal to 500 nm.

The first contact layer 106 is formed from a nitride semiconductor and may be, for example, a n-type GaN layer. The first contact layer 106 may have a thickness of greater than or equal to 1 μm and less than or equal to 5 μm.

Although not shown, the active layer 108 has a quantum well structure including a well layer and barrier layers. The barrier layers have a larger band gap than the well layer and sandwich the well layer. The active layer 108 may have multiple quantum well (MQW) structures. In this case, the active layer 108 has a plurality of quantum well structures. In an example, the active layer 108 includes multiple AlBInGaN layers differing in composition. The composition proportion of indium (In) in a barrier layer is smaller than that in a well layer so that the barrier layer has a larger band gap than the well layer.

The electron blocking layer 110 is formed on the active layer 108 and is formed from a nitride semiconductor including an acceptor impurity. The electron blocking layer 110 limits the outflow of electrons from the active layer 108, thereby increasing the recombination efficiency of electrons and holes. In an example, the electron blocking layer 110 is an AlGaN layer (p-type AlGaN layer) doped with an acceptor impurity. The acceptor impurity being a dopant in the electron blocking layer 110 heightens the barrier of the electron blocking layer 110 against electrons. The electron blocking layer 110 may have a thickness of, for example, greater than or equal to 10 nm and less than or equal to 150 nm.

The electron blocking layer 110 includes an upper surface 110A (first surface), which is in contact with the second contact layer 112, and a bottom surface 110B (second surface) opposite to the upper surface 110A in the thickness-wise direction of the electron blocking layer 110. In the present embodiment, the bottom surface 110B is in contact with the active layer 108. The upper surface 110A and the bottom surface 110B intersect with the thickness-wise direction of the electron blocking layer 110 and, in the present embodiment, are orthogonal to the thickness-wise direction of the electron blocking layer 110.

The electron blocking layer 110 may include at least two acceptor impurities. In an example, the acceptor impurities include Zn and Mg. The concentration profile of Zn in the thickness-wise direction of the electron blocking layer 110 differs from the concentration profile of Mg in the thickness-wise direction of the electron blocking layer 110.

In an example, the maximum concentration of Zn in the electron blocking layer 110 is greater than or equal to $1\times10^{18}$ $cm^{-3}$ and less than or equal to $2\times10^{19}$ $cm^{-3}$. In an example, the maximum concentration of Mg in the electron blocking layer 110 is greater than or equal to $1\times10^{19}$ $cm^{-3}$ and less than or equal to $1\times10^{20}$ $cm^{-3}$.

As described above, the electron blocking layer 110 including the acceptor impurities limits the outflow of electrons from the active layer 108, thereby increasing the recombination efficiency of electrons and holes.

The second contact layer 112 is formed from a nitride semiconductor and may be, for example, a p-type GaN layer. The second contact layer 112 may have a thickness of greater than or equal to 0.2 μm and less than or equal to 1 μm.

The first electrode 114 and the second electrode 116 may be formed from a metal such as Al, Ti, Au, or Pd or an alloy of any combination of the metals. The first electrode 114 and the second electrode 116 are in ohmic contact with the first contact layer 106 and the second contact layer 112, respectively.

The concentration profile of the acceptor impurities in the electron blocking layer 110 of the present embodiment will now be described.

As shown in FIG. 7, the electron blocking layer 110 may include a first region 110R1 and a second region 110R2. However, there is no physical boundary between the first region 110R1 and the second region 110R2. The first region 110R1 and the second region 110R2 are located adjacent to each other and arranged in the thickness-wise direction of the electron blocking layer 110. More specifically, the electron blocking layer 110 includes the first region 110R1 and the second region 110R2 that are arranged in order from the lower side in the thickness-wise direction. Thus, the first region 110R1 may be referred to as the lowermost region of the electron blocking layer 110.

The first region 110R1 includes the bottom surface 110B and is in contact with the active layer 108. In the first region 110R1, the concentration of Zn is higher than the concentration of Mg.

The second region 110R2 is located adjacent to the first region 110R1 in the thickness-wise direction of the electron blocking layer 110. In the present embodiment, the electron blocking layer 110 has a two-layer structure in which the second region 110R2 is formed on the first region 110R1. Thus, in the present embodiment, the second region 110R2 includes the upper surface 110A.

In the second region 110R2, the concentration of Mg is higher than or equal to the concentration of Zn. More specifically, the electron blocking layer 110 of the present embodiment includes a two-layer structure including the first region 110R1, in which the concentration of Zn is relatively high, and the second region 110R2, in which the concentration of Mg is relatively high.

The first region 110R1 may be greater in thickness than the second region 110R2. Alternatively, the first region 110R1 and the second region 110R2 may be equal in thickness. The first region 110R1 may be smaller in thickness than the second region 110R2.

The first region 110R1 and the second region 110R2 of the electron blocking layer 110 described above are formed because the concentration profile of Zn has a steeper increase than the concentration profile of Mn in the vicinity of the bottom surface 110B of the electron blocking layer 110.

FIG. 2 shows the concentration profiles of Zn and Mg, which are doped in a portion of the GaN layer. Also, when a portion of an AlGaN layer is doped with Zn and Mg, the concentration profiles have properties similar to those shown in FIG. 2. Therefore, as in the present embodiment, when the electron blocking layer 110 is formed from AlGaN, the concentration profile of Zn being a dopant in the electron blocking layer 110 also has a steep increase in the vicinity of the bottom surface 110B. In addition, although the concentration profile of Mg has a slower increase than the concentration of Zn, the electron blocking layer 110 is doped with a relatively high concentration of Mg.

An example of a method for manufacturing the nitride semiconductor device 100 will be briefly described.

In an example, MOCVD is used to epitaxially grow the buffer layer 104, which is an AlN layer, the first contact layer 106, which is an n-type GaN layer, the active layer 108 having an MQW structure, the electron blocking layer 110, which is a p-type AlGaN layer, and the second contact layer 112, which is a p-type GaN layer, on the substrate 102, which is a sapphire substrate. The layers described above are formed from nitride semiconductors having lattice constants relatively close to each other. This allows for sequential epitaxial growth of the layers. In another example, the buffer layer 104 may be a GaN layer grown at a relatively low temperature of greater than or equal to 500° C. and less than or equal to 600° C.

While a desired layer is epitaxially growing, a doping gas is supplied to the growth chamber so that the layer is doped with an impurity. Examples of the doping gas include silane ($SiH_4$) for doping with Si, $Cp_2Mg$ for doping with Mg, and DMZn for doping with Zn.

In an example, while a GaN layer corresponding to the first contact layer 106 is growing, $SiH_4$ is supplied to the chamber to form an n-type GaN layer that is doped with Si. While an AlGaN layer corresponding to the electron blocking layer 110 is growing, DMZn and $Cp_2Mg$ are supplied to the chamber to form a p-type AlGaN layer that is doped with Zn and Mg. Then, while a GaN layer corresponding to the second contact layer 112 is growing, $Cp_2Mg$ is supplied to the chamber to form a p-type GaN layer that is doped with Mg.

Subsequent to the formation of the second contact layer 112, for example, reactive-ion etching is performed to mesa-etch from the second contact layer 112 to an intermediate portion of the first contact layer 106 to expose the surface of the first contact layer 106. Then, for example, vapor deposition is performed to form the first electrode 114 on the exposed surface of the first contact layer 106 and form the second electrode 116 on the second contact layer 112.

The operation of the nitride semiconductor device 100 of the second embodiment will be described below.

The electron blocking layer 110 is doped with the acceptor impurities including Zn and Mg. The concentration profile of Zn in the thickness-wise direction of the electron blocking layer 110 differs from the concentration profile of Mg in the thickness-wise direction of the electron blocking layer 110. In the example shown in FIG. 7, the concentration of Zn is higher than the concentration of Mg in the first region 110R1 including the bottom surface 110B of the electron blocking layer 110. Thus, in the vicinity of the bottom surface 110B, the concentration of the acceptor impurities in the electron blocking layer 110 is higher than that when only Mg is used as the acceptor impurity.

In the second region 110R2 of the electron blocking layer 110, which is adjacent to the first region 110R1, the concentration of Mg is higher than or equal to the concentration of Zn. Thus, the electron blocking layer 110 includes overall a greater amount of the acceptor impurities than when only Zn is used as the acceptor impurity.

As described above, when the electron blocking layer 110 includes Zn and Mg as the acceptor impurities, the efficiency of the electron blocking layer 110 for limiting the outflow of electrons from the active layer 108 is improved. This limits decreases in the light emitting efficiency of the nitride semiconductor device 100 and achieves a high luminance of the nitride semiconductor device 100.

The second embodiment has the following advantages.

(2-1) The nitride semiconductor device 100 includes the electron blocking layer 110 formed on the active layer 108. The electron blocking layer 110 is formed from a nitride semiconductor including acceptor impurities. The acceptor impurities include Zn and Mg. The concentration profile of Zn in the thickness-wise direction of the electron blocking layer 110 differs from the concentration profile of Mg in the thickness-wise direction of the electron blocking layer 110.

This structure improves the efficiency of the electron blocking layer 110 for limiting the outflow of electrons from the active layer 108 as compared to a structure in which the acceptor impurity included in the electron blocking layer 110 is only Mg. This limits decreases in the light emitting efficiency of the nitride semiconductor device 100 and achieves a high luminance of the nitride semiconductor device 100.

(2-2) The maximum concentration of Zn in the electron blocking layer 110 is greater than or equal to $1\times10^{18}$ $cm^{-3}$ and less than or equal to $2\times10^{19}$ $cm^{-3}$. The maximum concentration of Mg in the electron blocking layer 110 is greater than or equal to $1\times10^{19}$ $cm^{-3}$ and less than or equal to $1\times10^{20}$ $cm^{-3}$.

In this structure, since the concentration of Zn and the concentration of Mg included in the electron blocking layer 110 are both relatively high, the efficiency of the electron blocking layer 110 for limiting the outflow of electrons from the active layer 108 is improved. This limits decreases in the light emitting efficiency of the nitride semiconductor device 100 and achieves a high luminance of the nitride semiconductor device 100.

(2-3) In the first region 110R1 including the bottom surface 110B of the electron blocking layer 110, the concentration of Zn is higher than the concentration of Mg.

In this structure, the electron blocking layer 110 includes Zn, which has a concentration profile having a steep increase, in the first region 110R1. This allows the electron blocking layer 110 to have an even higher concentration of the acceptor impurities in the vicinity of the bottom surface 110B. Accordingly, the efficiency of the electron blocking layer 110 for limiting the outflow of electrons from the active layer 108 is improved. This limits decreases in the light emitting efficiency of the nitride semiconductor device 100 and achieves a high luminance of the nitride semiconductor device 100.

(2-4) In the second region 110R2, which is adjacent to the first region 110R1 in the thickness-wise direction of the electron blocking layer 110, the concentration of Mg is higher than or equal to the concentration of Zn.

In this structure, the electron blocking layer 110 includes Mg, which can have a higher concentration than Zn, in the second region 110R2. This allows the electron blocking layer 110 to include overall a greater amount of the acceptor impurities. Accordingly, the efficiency of the electron blocking layer 110 for limiting the outflow of electrons from the active layer 108 is improved. This limits decreases in the light emitting efficiency of the nitride semiconductor device 100 and achieves a high luminance of the nitride semiconductor device 100.

(2-5) In the electron blocking layer 110, the first region 110R1 is greater in thickness than the second region 110R2.

This structure allows the electron blocking layer 110 to include a greater amount of Zn, which has a concentration profile having a relatively steep increase, in the vicinity of the bottom surface 110B of the electron blocking layer 110. Accordingly, the efficiency of the electron blocking layer 110 for limiting the outflow of electrons from the active layer 108 is improved. This limits decreases in the light emitting efficiency of the nitride semiconductor device 100 and achieves a high luminance of the nitride semiconductor device 100.

Third Embodiment

A third embodiment of a nitride semiconductor device 200 will now be described. The nitride semiconductor device 10 of the first embodiment is an HEMT. The nitride semiconductor device 200 of the third embodiment is a light emitting element.

Figure 8:
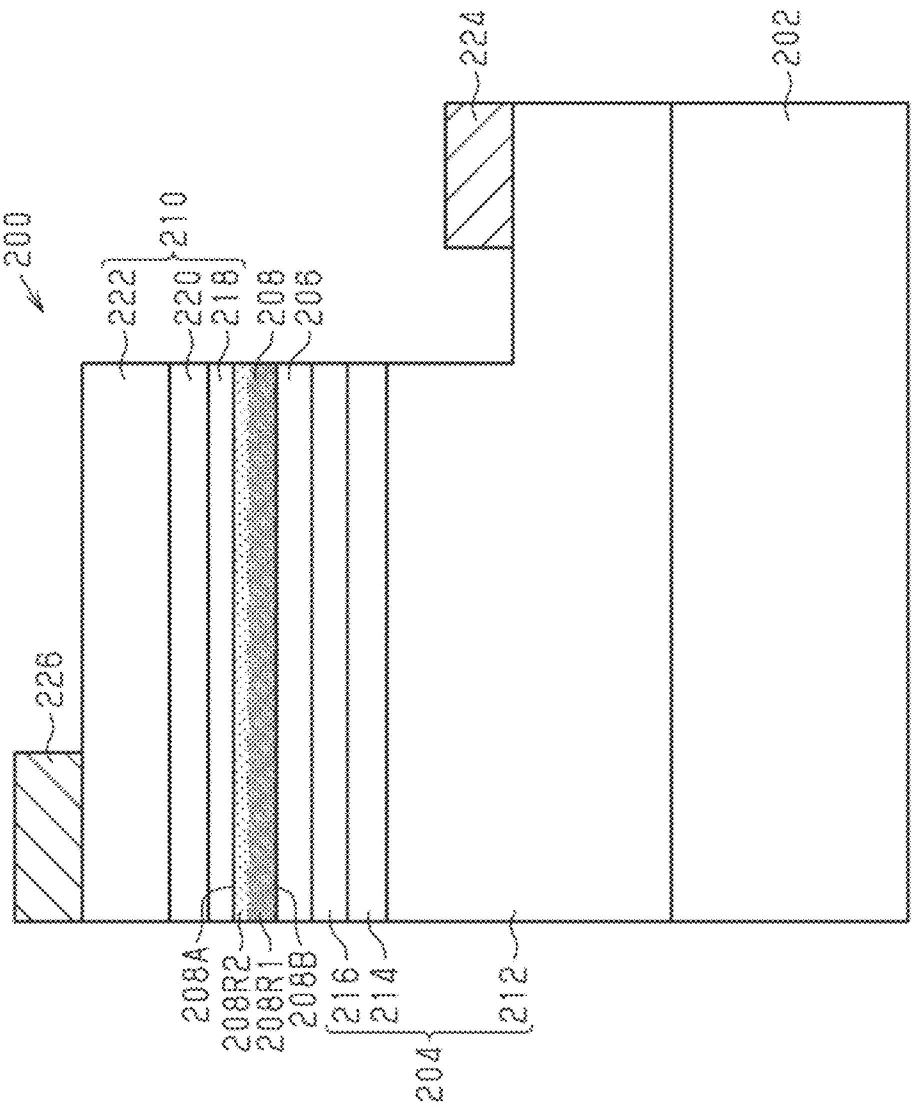
FIG. 8 is a schematic cross-sectional view showing an example of a nitride semiconductor device in a third embodiment.

FIG. 8 is a schematic cross-sectional view showing an example of a nitride semiconductor device 200 in the third embodiment.

The nitride semiconductor device 200 is a laser diode (LD) that uses a nitride semiconductor. The nitride semiconductor device 200 includes a substrate 202, a first nitride semiconductor layer 204 formed on the substrate 202, an active layer 206 formed on the first nitride semiconductor layer 204 and having a quantum well structure, an electron blocking layer 208 formed on the active layer 206 and formed from a nitride semiconductor including an acceptor impurity, and a second nitride semiconductor layer 210 formed on the electron blocking layer 208. The first nitride semiconductor layer 204 includes a first contact layer 212, a first cladding layer 214 formed on the first contact layer 212, and a first guide layer 216 formed on the first cladding layer 214. The second nitride semiconductor layer 210 includes a second guide layer 218, a second cladding layer 220 formed on the second guide layer 218, and a second contact layer 222 formed on the second cladding layer 220. The nitride semiconductor device 200 further includes a first electrode 224 formed on an exposed surface of the first contact layer 212 and a second electrode 226 formed on the second contact layer 222.

In an example, the substrate 202 is a GaN substrate. Alternatively, the substrate 202 may be a sapphire substrate. The first contact layer 212 is formed from a nitride semiconductor and may be, for example, an n-type GaN layer.

The first cladding layer 214 is formed from a nitride semiconductor and may include, for example, at least one of an n-type GaN layer, an n-type AlGaN layer, or an n-type InGaN layer. In an example, the first cladding layer 214 is an n-type AlGaN layer. The first cladding layer 214 confines light emitted from the active layer 206 and has band gap energy that is larger than that of the first guide layer 216.

The first guide layer 216 is formed from a nitride semiconductor and may include, for example, at least one of an n-type GaN layer, an n-type AlGaN layer, or an n-type InGaN layer. In an example, the first guide layer 216 is an n-type InGaN layer. The first guide layer 216 adjusts the density of light in the active layer 206 and has band gap energy that is larger than that of the active layer 206.

Although not shown, the active layer 206 has a quantum well structure including a well layer and barrier layers. The barrier layers have a larger band gap than the well layer and sandwich the well layer. The active layer 206 may have MQW structures. In this case, the active layer 206 has a plurality of quantum well structures. In an example, the well layer is formed from a nitride semiconductor such as InGaN so that the barrier layer has a larger band gap than the well layer. The barrier layer is formed from a nitride semiconductor such as InGaN or GaN. A barrier layer having band gap energy that is larger than that of the barrier layer and formed from an AlGaN layer may be disposed between the quantum well structures.

The electron blocking layer 208 is formed on the active layer 206 and is formed from a nitride semiconductor including an acceptor impurity. The electron blocking layer 208 limits the outflow of electrons from the active layer 206, thereby increasing the recombination efficiency of electrons and holes. In an example, the electron blocking layer 208 is an AlGaN layer (p-type AlGaN layer) doped with an acceptor impurity. The acceptor impurity being a dopant in the electron blocking layer 208 heightens the barrier of the electron blocking layer 208 against electrons. The electron blocking layer 208 may have a thickness of, for example, greater than or equal to 10 nm and less than or equal to 150 nm.

The electron blocking layer 208 includes an upper surface 208A (first surface), which is in contact with the second guide layer 218, and a bottom surface 208B (second surface) opposite to the upper surface 208A in the thickness-wise direction of the electron blocking layer 208. In the present embodiment, the bottom surface 208B is in contact with the active layer 206. The upper surface 208A and the bottom surface 208B intersect with the thickness-wise direction of the electron blocking layer 208 and, in the present embodiment, are orthogonal to the thickness-wise direction of the electron blocking layer 208.

The electron blocking layer 208 may include at least two acceptor impurities. In an example, the acceptor impurities include Zn and Mg. The concentration profile of Zn in the thickness-wise direction of the electron blocking layer 208 differs from the concentration profile of Mg in the thickness-wise direction of the electron blocking layer 208.

In an example, the maximum concentration of Zn in the electron blocking layer 208 is greater than or equal to $1\times10^{18}$ $cm^{-3}$ and less than or equal to $2\times10^{19}$ $cm^{-3}$. In an example, the maximum concentration of Mg in the electron blocking layer 208 is greater than or equal to $1\times10^{19}$ $cm^{-3}$ and less than or equal to $1\times10^{20}$ $cm^{-3}$.

As described above, the electron blocking layer 208 including the acceptor impurities limits the outflow of electrons from the active layer 206, thereby increasing the recombination efficiency of electrons and holes.

The second guide layer 218 is formed from a nitride semiconductor and includes, for example, at least one of a p-type GaN layer or a p-type InGaN layer. In an example, the second guide layer 218 is a p-type GaN layer. The second guide layer 218 adjusts the density of light in the active layer 206 and has band gap energy that is larger than that of the active layer 206.

The second cladding layer 220 is formed from a nitride semiconductor and includes, for example, at least one of a p-type GaN layer or a p-type InGaN layer. In an example, the second cladding layer 220 is a p-type InGaN layer. The second cladding layer 220 confines light emitted from the active layer 206 and has band gap energy that is larger than that of the second guide layer 218.

The second contact layer 222 is formed from a nitride semiconductor and may be, for example, a p-type GaN layer.

The first electrode 224 and the second electrode 226 may be formed from a metal such as Al, Ti, Au, or Pd or an alloy of any combination of the metals. The first electrode 224 and the second electrode 226 are in ohmic contact with the first contact layer 212 and the second contact layer 222, respectively.

The concentration profile of the acceptor impurities in the electron blocking layer 208 of the present embodiment will now be described.

As shown in FIG. 8, the electron blocking layer 208 may include a first region 208R1 and a second region 208R2. However, there is no physical boundary between the first region 208R1 and the second region 208R2. The first region 208R1 and the second region 208R2 are located adjacent to each other and arranged in the thickness-wise direction of the electron blocking layer 208. More specifically, the electron blocking layer 208 includes the first region 208R1 and the second region 208R2 that are arranged in order from the lower side in the thickness-wise direction. Thus, the first region 208R1 may be referred to as the lowermost region of the electron blocking layer 208.

The first region 208R1 includes the bottom surface 208B and is in contact with the active layer 206. In the first region 208R1, the concentration of Zn is higher than the concentration of Mg.

The second region 208R2 is located adjacent to the first region 208R1 in the thickness-wise direction of the electron blocking layer 208. In the present embodiment, the electron blocking layer 208 has a two-layer structure in which the second region 208R2 is formed on the first region 208R1. Thus, in the present embodiment, the second region 208R2 includes the upper surface 208A.

In the second region 208R2, the concentration of Mg is higher than or equal to the concentration of Zn. More specifically, the electron blocking layer 208 of the present embodiment includes a two-layer structure including the first region 208R1, in which the concentration of Zn is relatively high, and the second region 208R2, in which the concentration of Mg is relatively high.

The first region 208R1 may be greater in thickness than the second region 208R2. Alternatively, the first region 208R1 and the second region 208R2 may be equal in thickness. The first region 208R1 may be smaller in thickness than the second region 208R2.

The first region 208R1 and the second region 208R2 of the electron blocking layer 208 described above are formed because the concentration profile of Zn has a steeper increase than the concentration profile of Mn in the vicinity of the bottom surface 208B of the electron blocking layer 208.

FIG. 2 shows the concentration profiles of Zn and Mg, which are doped in a portion of the GaN layer. Also, when a portion of an AlGaN layer is doped with Zn and Mg, the concentration profiles have properties similar to those shown in FIG. 2. Therefore, as in the present embodiment, when the electron blocking layer 208 is formed from AlGaN, the concentration profile of Zn being a dopant in the electron blocking layer 208 also has a steep increase in the vicinity of the bottom surface 208B. In addition, although the concentration profile of Mg has a slower increase than the concentration of Zn, the electron blocking layer 208 is doped with a relatively high concentration of Mg.

An example of a method for manufacturing the nitride semiconductor device 200 will be schematically described.

In an example, MOCVD is used to epitaxially grow the first contact layer 212, which is an n-type GaN layer, the first cladding layer 214, which is an n-type AlGaN layer, the first guide layer 216, which is an n-type InGaN layer, the active layer 206 having an MQW structure, the electron blocking layer 208, which is a p-type AlGaN layer, the second guide layer 218, which is a p-type GaN layer, the second cladding layer 220, which is a p-type InGaN layer, and the second contact layer 222, which is a p-type GaN layer, on the substrate 202, which is a GaN substrate. The layers described above are formed from nitride semiconductors having lattice constants relatively close to each other. This allows for sequential epitaxial growth of the layers.

While a desired layer is epitaxially growing, a doping gas is supplied to the growth chamber so that the layer is doped with an impurity. Examples of the doping gas include $SiH_4$ for doping with Si, $Cp_2Mg$ for doping with Mg, and DMZn for doping with Zn.

In an example, while a layer corresponding to the first nitride semiconductor layer 204 (i.e., the first contact layer 212, the first cladding layer 214, and the first guide layer 216) is growing, $SiH_4$ is supplied to the chamber to form an n-type nitride semiconductor layer that is doped with Si. While an AlGaN layer corresponding to the electron blocking layer 208 is growing, DMZn and $Cp_2Mg$ are supplied to the chamber to form a p-type AlGaN layer that is doped with Zn and Mg. While a layer corresponding to the second nitride semiconductor layer 210 (i.e., the second guide layer 218, the second cladding layer 220, and the second contact layer 222) is growing, $Cp_2Mg$ is supplied to the chamber to form a p-type nitride semiconductor layer that is doped with Mg.

Subsequent to the formation of the second contact layer 222, for example, reactive-ion etching is performed to mesa-etch a region from the second contact layer 222 to an intermediate portion of the first contact layer 212 to expose the surface of the first contact layer 212. Then, for example, vapor deposition is performed to form the first electrode 224 on the exposed surface of the first contact layer 212 and form the second electrode 226 on the second contact layer 222.

The operation of the nitride semiconductor device 200 of the third embodiment will be described below.

The electron blocking layer 208 is doped with the acceptor impurities including Zn and Mg. The concentration profile of Zn in the thickness-wise direction of the electron blocking layer 208 differs from the concentration profile of Mg in the thickness-wise direction of the electron blocking layer 208. In the example shown in FIG. 8, the concentration of Zn is higher than the concentration of Mg in the first region 208R1 including the bottom surface 208B of the electron blocking layer 208. Thus, in the vicinity of the bottom surface 208B, the concentration of the acceptor impurities in the electron blocking layer 208 is higher than that when only Mg is used as the acceptor impurity.

In the second region 208R2 of the electron blocking layer 208, which is adjacent to the first region 208R1, the concentration of Mg is higher than or equal to the concentration of Zn. Thus, the electron blocking layer 208 includes overall a greater amount of the acceptor impurities than when only Zn is used as the acceptor impurity.

As described above, when the electron blocking layer 208 includes Zn and Mg as the acceptor impurity, the efficiency of the electron blocking layer 208 for limiting the outflow of electrons from the active layer 206 is improved. This limits decreases in the light emitting efficiency of the nitride semiconductor device 200 and achieves a high luminance of the nitride semiconductor device 200.

The third embodiment has the following advantages.

(3-1) The nitride semiconductor device 200 includes the electron blocking layer 208 formed on the active layer 206. The electron blocking layer 208 is formed from a nitride semiconductor including acceptor impurities. The acceptor impurities include Zn and Mg. The concentration profile of Zn in the thickness-wise direction of the electron blocking layer 208 differs from the concentration profile of Mg in the thickness-wise direction of the electron blocking layer 208.

This structure improves the efficiency of the electron blocking layer 208 for limiting the outflow of electrons from the active layer 206 as compared to a structure in which the acceptor impurity included in the electron blocking layer 208 is only Mg. This limits decreases in the light emitting efficiency of the nitride semiconductor device 200 and achieves a high luminance of the nitride semiconductor device 200.

(3-2) The maximum concentration of Zn in the electron blocking layer 208 is greater than or equal to $1\times10^{18}$ $cm^{-3}$ and less than or equal to $2\times10^{19}$ $cm^{-3}$. The maximum concentration of Mg in the electron blocking layer 208 is greater than or equal to $1\times10^{19}$ $cm^{-3}$ and less than or equal to $1\times10^{20}$ $cm^{-3}$.

In this structure, since the concentration of Zn and the concentration of Mg included in the electron blocking layer 208 are both relatively high, the efficiency of the electron blocking layer 208 for limiting the outflow of electrons from the active layer 206 is improved. This limits decreases in the light emitting efficiency of the nitride semiconductor device 200 and achieves a high luminance of the nitride semiconductor device 200.

(3-3) The concentration of Zn is higher than the concentration of Mg in the first region 208R1 including the bottom surface 208B of the electron blocking layer 208. In this structure, the electron blocking layer 208 includes Zn, which has a concentration profile having a steep increase, in the first region 208R1. This allows the electron blocking layer 208 to have an even higher concentration of the acceptor impurities in the vicinity of the bottom surface 208B. Accordingly, the efficiency of the electron blocking layer 208 for limiting the outflow of electrons from the active layer 206 is improved. This limits decreases in the light emitting efficiency of the nitride semiconductor device 200 and achieves a high luminance of the nitride semiconductor device 200.

(3-4) In the second region 208R2, which is adjacent to the first region 208R1 in the thickness-wise direction of the electron blocking layer 208, the concentration of Mg is higher than or equal to the concentration of Zn.

In this structure, the electron blocking layer 208 includes Mg, which can have a higher concentration than Zn, in the second region 208R2. This allows the electron blocking layer 208 to include overall a greater amount of the acceptor impurities. Accordingly, the efficiency of the electron blocking layer 208 for limiting the outflow of electrons from the active layer 206 is improved. This limits decreases in the light emitting efficiency of the nitride semiconductor device 200 and achieves a high luminance of the nitride semiconductor device 200.

(3-5) In the electron blocking layer 208, the first region 208R1 is greater in thickness than the second region 208R2.

This structure allows the electron blocking layer 208 to include a greater amount of Zn, which has a concentration profile having a relatively steep increase, in the vicinity of the bottom surface 208B of the electron blocking layer 208. Accordingly, the efficiency of the electron blocking layer 208 for limiting the outflow of electrons from the active layer 206 is improved. This limits decreases in the light emitting efficiency of the nitride semiconductor device 200 and achieves a high luminance of the nitride semiconductor device 200.

Modified Examples

The embodiments described above may be modified as follows. The embodiments described above and the modified examples described below can be combined as long as the combined modifications remain technically consistent with each other.

In the first embodiment, the gate layer 22 includes the first region 22R1 and the second region 22R2. Alternatively, the gate layer 22 may further include a third region 22R3 in which the concentration of Zn is higher than the concentration of Mg. The third region 22R3 is located adjacent to the second region 22R2 in the thickness-wise direction of the gate layer 22. The third region 22R3 may include the upper surface 22A of the gate layer 22. That is, the gate layer 22 may have a layered structure having three or more layers.

In the gate layer 22, the maximum concentration of Mg may be higher than the maximum concentration of Zn. In this case, the overall concentration of the impurities in the gate layer 22 is increased by increasing the thickness of the second region 22R2 to be greater than the thickness of the first region 22R1. Alternatively, the maximum concentration of Zn may be higher than the maximum concentration of Mg.

In the first embodiment, the acceptor impurity included in the gate layer 22 together with Mg is Zn. Alternatively, any impurity having a depth $E_r$-$E_v$ of the acceptor level from the valence band in the GaN layer that is greater than or equal to 0.2 eV and less than 0.6 eV may be used together with Mg.

In the second embodiment, the electron blocking layer 110 includes the first region 110R1 and the second region 110R2. Alternatively, the electron blocking layer 110 may further include a third region 110R3 in which the concentration of Zn is higher than the concentration of Mg. The third region 110R3 is located adjacent to the second region 110R2 in the thickness-wise direction of the electron blocking layer 110. The third region 110R3 may include the upper surface 110A of the electron blocking layer 110. That is, the electron blocking layer 110 may have a layered structure having three or more layers.

In the electron blocking layer 110, the maximum concentration of Mg may be higher than the maximum concentration of Zn. In this case, the overall concentration of the impurities in the electron blocking layer 110 is increased by increasing the thickness of the second region 110R2 to be greater than the thickness of the first region 110R1. Alternatively, the maximum concentration of Zn may be higher than the maximum concentration of Mg.

In the second embodiment, the electron blocking layer 110 includes the first region 110R1 and the second region 110R2. Alternatively, the concentration of Mg may be higher than the concentration of Zn in the entire region of the electron blocking layer 110. In this case, in the electron blocking layer 110, the maximum concentration of Mg may be at least twice the maximum concentration of Zn.

In the third embodiment, the electron blocking layer 208 includes the first region 208R1 and the second region 208R2. Alternatively, the electron blocking layer 208 may further include a third region 208R3 in which the concentration of Zn is higher than the concentration of Mg. The third region 208R3 is located adjacent to the second region 208R2 in the thickness-wise direction of the electron blocking layer 208. The third region 208R3 may include the upper surface 208A of the electron blocking layer 208. That is, the electron blocking layer 208 may have a layered structure of three or more layers.

In the electron blocking layer 208, the maximum concentration of Mg may be higher than the maximum concentration of Zn. In this case, the overall concentration of the impurities in the electron blocking layer 208 is increased by increasing the thickness of the second region 208R2 to be greater than the first region 208R1. Alternatively, the maximum concentration of Zn may be higher than the maximum concentration of Mg.

In the third embodiment, the electron blocking layer 208 includes the first region 208R1 and the second region 208R2. Alternatively, the concentration of Mg may be higher than concentration of Zn in the entire region of the electron blocking layer 208. In this case, in the electron blocking layer 208, the maximum concentration of Mg may be at least twice the maximum concentration of Zn.

In the third embodiment, an insulation layer of $SiO_2$ or the like may be disposed on the second contact layer 222 to confine current. This increases the current density of the active layer 206.

In the present disclosure, the term "on" includes the meaning of "above" in addition to the meaning of "on" unless otherwise clearly indicated in the context. Therefore, the phrase "first layer formed on second layer" is intended to mean that the first layer may be formed on the second layer in contact with the second layer in one embodiment and that the first layer may be located above the second layer without contacting the second layer in another embodiment. In other words, the term "on" does not exclude a structure in which another layer is formed between the first layer and the second layer. For example, the above embodiment in which the electron supply layer 18 is formed on the electron transit layer 16 includes a structure in which an intermediate layer is disposed between the electron supply layer 18 and the electron transit layer 16 to stably form the 2DEG 20.

The Z-axis direction as referred to in the present disclosure does not necessarily have to be the vertical direction and does not necessarily have to fully conform to the vertical direction. In the structures according to the present disclosure (e.g., the structure shown in FIG. 1), "upward" and "downward" in the Z-axis direction as referred to in the present description are not limited to "upward" and "downward" in the vertical direction. For example, the X-axis direction may conform to the vertical direction. The Y-axis direction may conform to the vertical direction.

CLAUSES

The technical aspects that are understood from the embodiments and the modified examples will be described below. To facilitate understanding without intention to limit, the reference signs of the elements in the embodiments are given to the corresponding elements in the clause with parentheses. The reference signs used as examples to facilitate understanding, and the elements in each clause are not limited to those elements given with the reference signs.

Clause A1

A nitride semiconductor device (10), including:

an electron transit layer (16) formed from a nitride semiconductor;

an electron supply layer (18) formed on the electron transit layer (16), the electron supply layer (18) being formed from a nitride semiconductor having a band gap that is larger than that of the electron transit layer (16);

a gate layer (22) formed on the electron supply layer (18), the gate layer (22) being formed from a nitride semiconductor including an acceptor impurity and having a band gap that is smaller than that of the electron supply layer (18);

a gate electrode (24) formed on the gate layer (22); and a source electrode (28) and a drain electrode (30) that are in contact with the electron supply layer (18), where the acceptor impurity includes zinc and magnesium, the zinc has a concentration profile in a thickness-wise direction of the gate layer (22), the magnesium has a concentration profile in the thickness-wise direction of the gate layer (22), and the concentration profile of the zinc differs from the concentration profile of the magnesium.

Clause A2

The nitride semiconductor device (10) according to clause A1, where the gate layer (22) includes a first surface (22A) in contact with the gate electrode (24) and a second surface (22B) opposite to the first surface (22A) in the thickness-wise direction of the gate layer (22), the gate layer (22) includes a first region (22R1) including the second surface (22B), and a second region (22R2) located adjacent to the first region (22R1) in the thickness-wise direction of the gate layer (22), in the first region (22R1), the zinc is higher in concentration than the magnesium, and in the second region (22R2), concentration of the magnesium is higher than or equal to concentration of the zinc.

Clause A3

The nitride semiconductor device according to clause A2, where the gate layer (22) has a two-layer structure in which the second region (22R2) is formed on the first region (22R1), and the second region (22R2) of the gate layer (22) includes the first surface (22A) of the gate layer (22).

Clause A4

The nitride semiconductor device (10) according to clause A2 or A3, where the first region (22R1) of the gate layer (22) is smaller in thickness than the second region (22R2).

Clause B1

A nitride semiconductor device (100; 200), including:

a first nitride semiconductor layer (106; 204);

an active layer (108; 206) formed on the first nitride semiconductor layer (106; 204) and having a quantum well structure;

an electron blocking layer (110; 208) formed on the active layer (108; 206) and formed from a nitride semiconductor including an acceptor impurity; and a second nitride semiconductor layer (112; 210) formed on the electron blocking layer (110; 208), where the acceptor impurity includes magnesium and zinc, the zinc has a concentration profile in a thickness-wise direction of the electron blocking layer (110; 208), the magnesium has a concentration profile in the thickness-wise direction of the electron blocking layer (110; 208), and the concentration profile of the zinc differs from the concentration profile of the magnesium.

Clause B2

The nitride semiconductor device (100; 200) according to clause B1, where a maximum concentration of the zinc in the electron blocking layer (110; 208) is greater than or equal to $1\times10^{18}$ $cm^{-3}$ and less than or equal to $2\times10^{19}$ $cm^{-3}$, and a maximum concentration of the magnesium in the electron blocking layer (110; 208) is greater than or equal to $1\times10^{19}$ $cm^{-3}$ and less than or equal to $1\times10^{20}$ $cm^{-3}$.

Clause B3

The nitride semiconductor device (100; 200) according to clause B1 or B2, where the electron blocking layer (110; 208) includes a first surface (110A; 208A) in contact with the second nitride semiconductor layer (112; 210) and a second surface (110B; 208B) in contact with the active layer (108; 206), the electron blocking layer (110; 208) includes a first region (110R1; 208R1) including the second surface (110B; 208B), and in the first region (110R1; 208R1), the zinc is higher in concentration than the magnesium.

Clause B4

The nitride semiconductor device (100; 200) according to clause B3, where the electron blocking layer (110; 208) further includes a second region (110R2; 208R2) located adjacent to the first region (110R1; 208R1) in the thickness-wise direction of the electron blocking layer (110; 208), and in the second region (110R2; 208R2), concentration of the magnesium is higher than or equal to concentration of the zinc.

Clause B5

The nitride semiconductor device (100; 200) according to clause B4, where the electron blocking layer (110; 208) has a two-layer structure in which the second region (110R2; 208R2) is formed on the first region (110R1; 208R1), and the second region (110R2; 208R2) of the electron blocking layer (110; 208) includes the first surface (110A; 208A) of the electron blocking layer (110; 208).

Clause B6

The nitride semiconductor device (100; 200) according to clause B4 or B5, where the first region (110R1; 208R1) of the electron blocking layer (110; 208) is greater in thickness than that of the second region (110R2; 208R2).

Clause B7

The nitride semiconductor device (100; 200) according to clause B4 or B5, where the first region (110R1; 208R1) of the electron blocking layer (110; 208) is smaller in thickness than the second region (110R2; 208R2).

Clause B8

The nitride semiconductor device (100; 200) according to clause B1 or B2, where in an entire region of the electron blocking layer (110; 208), the magnesium is higher in concentration than the zinc.

Clause B9

The nitride semiconductor device (100; 200) according to clause B8, where in the electron blocking layer (110; 208), a maximum concentration of the magnesium is at least twice a maximum concentration of the zinc.

Clause B10

The nitride semiconductor device (100; 200) according to any one of clauses B1 to B9, where the electron blocking layer (110; 208) is formed from AlGaN including the acceptor impurity.

Clause B11

The nitride semiconductor device (100; 200) according to any one of clauses B1 to B10, where the electron blocking layer (110; 208) has a thickness that is greater than or equal to 10 nm and less than or equal to 150 nm.

Clause B12

The nitride semiconductor device (100) according to any one of clauses B1 to B11, where the first nitride semiconductor layer (106) includes a first contact layer (106), and the second nitride semiconductor layer (112) includes a second contact layer (112).

Clause B13

The nitride semiconductor device (200) according to any one of clauses B1 to B11, where the first nitride semiconductor layer (204) includes a first contact layer (212), a first cladding layer (214) formed on the first contact layer (212), and a first guide layer (216) formed on the first cladding layer (214), and the second nitride semiconductor layer (210) includes a second guide layer (218), a second cladding layer (220) formed on the second guide layer (218), and a second contact layer (222) formed on the second cladding layer (220).

Clause B14

The nitride semiconductor device (100; 200) according to any one of clauses B1 to B13, where the nitride semiconductor device (100; 200) includes a light emitting element.

The description above illustrates examples. One skilled in the art may recognize further possible combinations and replacements of the elements and methods (manufacturing processes) in addition to those listed for purposes of describing the techniques of the present disclosure. The present disclosure is intended to include any substitute, modification, changes included in the scope of the disclosure including the claims.

REFERENCE SIGNS LIST

10) nitride semiconductor device
12) substrate
14) buffer layer
16) electron transit layer
18) electron supply layer
22) gate layer
22A) upper surface (first surface)
22B) bottom surface (second surface)
22R1) first region
22R2) second region
24) gate electrode
26) passivation layer
28) source electrode
30) drain electrode

The invention claimed is:

1. A nitride semiconductor device, comprising:

an electron transit layer formed from a nitride semiconductor;

an electron supply layer formed on the electron transit layer, the electron supply layer being formed from a nitride semiconductor having a band gap that is larger than a band gap of the electron transit layer;

a gate layer formed on the electron supply layer, the gate layer being formed from a nitride semiconductor including an acceptor impurity and having a band gap that is smaller than the band gap of the electron supply layer;

a gate electrode formed on the gate layer; and a source electrode and a drain electrode that are in contact with the electron supply layer, wherein the acceptor impurity includes zinc and magnesium, the zinc has a concentration profile in a thickness-wise direction of the gate layer, the magnesium has a concentration profile in the thickness-wise direction of the gate layer, the concentration profile of the zinc differs from the concentration profile of the magnesium, and the gate layer includes both the zinc and the magnesium throughout the gate layer.

2. The nitride semiconductor device according to claim 1, wherein a maximum concentration of the zinc in the gate layer is greater than or equal to $1\times10^{18}$ $cm^{-3}$ and less than or equal to $2\times10^{19}$ $cm^{-3}$, and a maximum concentration of the magnesium in the gate layer is greater than or equal to $1\times10^{19}$ $cm^{-3}$ and less than or equal to $2\times10^{19}$ $cm^{-3}$.

3. The nitride semiconductor device according to claim 1, wherein the gate layer includes a first surface in contact with the gate electrode and a second surface opposite to the first surface in the thickness-wise direction of the gate layer and in contact with an upper surface of the electron supply layer, the gate layer includes a first region including the second surface, and in the first region, the zinc is higher in concentration than the magnesium at any depth within the first region.

4. The nitride semiconductor device according to claim 3, wherein the gate layer further includes a second region located adjacent to the first region in the thickness-wise direction of the gate layer, and in the second region, a concentration of the magnesium is higher than or equal to a concentration of the zinc at any depth within the second region.

5. The nitride semiconductor device according to claim 4, wherein the gate layer has a two-layer structure in which the second region is formed on the first region, and the second region of the gate layer includes the first surface of the gate layer.

6. The nitride semiconductor device according to claim 4, wherein the first region of the gate layer is greater in thickness than the second region.

7. The nitride semiconductor device according to claim 1, wherein in an entire region of the gate layer, the magnesium is higher in concentration than the zinc.

8. The nitride semiconductor device according to claim 7, wherein in the gate layer, a maximum concentration of the magnesium is at least twice a maximum concentration of the zinc.

9. The nitride semiconductor device according to claim 1, wherein the electron transit layer is formed from GaN, the electron supply layer is formed from AlGaN, and the gate layer is formed from GaN including the acceptor impurity.

10. The nitride semiconductor device according to claim 1, wherein the gate layer has a thickness that is greater than or equal to 80 nm and less than or equal to 150 nm.

11. The nitride semiconductor device according to claim 1, wherein the nitride semiconductor device includes a normally-off transistor.

12. The nitride semiconductor device according to claim 2, wherein the gate layer includes a first surface in contact with the gate electrode and a second surface opposite to the first surface in the thickness-wise direction of the gate layer and in contact with an upper surface of the electron supply layer, the gate layer includes a first region including the second surface, and in the first region, the zinc is higher in concentration than the magnesium at any depth within the first region.

13. The nitride semiconductor device according to claim 5, wherein the first region of the gate layer is greater in thickness than the second region.

14. The nitride semiconductor device according to claim 2, wherein in an entire region of the gate layer, the magnesium is higher in concentration than the zinc.

15. The nitride semiconductor device according to claim 2, wherein the electron transit layer is formed from GaN, the electron supply layer is formed from AlGaN, and the gate layer is formed from GaN including the acceptor impurity.

16. The nitride semiconductor device according to claim 2, wherein the gate layer has a thickness that is greater than or equal to 80 nm and less than or equal to 150 nm.

17. The nitride semiconductor device according to claim 2, wherein the nitride semiconductor device includes a normally-off transistor.

18. The nitride semiconductor device according to claim 1, wherein the gate layer includes a first surface in contact with the gate electrode and a second surface opposite to the first surface in the thickness-wise direction of the gate layer and in contact with an upper surface of the electron supply layer, the gate layer includes a first region including the second surface, and a second region located adjacent to the first region in the thickness-wise direction of the gate layer, in the first region, the zinc is higher in concentration than the magnesium at any depth within the first region, and in the second region, a concentration of the magnesium is higher than or equal to a concentration of the zinc at any depth within the second region.

19. The nitride semiconductor device according to claim 18, wherein the electron transit layer is formed from GaN, the electron supply layer is formed from AlGaN, and the gate layer is formed from GaN including the acceptor impurity.

20. The nitride semiconductor device according to claim 18, wherein the nitride semiconductor device includes a normally-off transistor.

* * * * *